United States Patent
Sadeh

[19]

[11] Patent Number: 6,018,303
[45] Date of Patent: *Jan. 25, 2000

[54] METHODS AND MEANS FOR IMAGE AND VOICE COMPRESSION

[75] Inventor: Ilan Sadeh, Tel Aviv, Israel

[73] Assignee: Visnet Ltd., Pardesia, Israel

[ * ] Notice: This patent is subject to a terminal disclaimer.

[21] Appl. No.: 09/188,526

[22] Filed: Nov. 10, 1998

Related U.S. Application Data

[63] Continuation of application No. 08/763,376, Dec. 13, 1996, Pat. No. 5,836,003, which is a continuation-in-part of application No. 08/112,186, Aug. 26, 1993, abandoned.

[30] Foreign Application Priority Data

Sep. 7, 1992 [IL] Israel ........................................ 103080

[51] Int. Cl.[7] .................................................... H03M 7/30
[52] U.S. Cl. .................................................. 341/51; 341/87
[58] Field of Search ........................................ 341/51, 87

[56] References Cited

U.S. PATENT DOCUMENTS

| | | | |
|---|---|---|---|
| 3,394,352 | 7/1968 | Wernikoff | 341/51 |
| 4,281,312 | 7/1981 | Knudson | 341/50 |
| 5,442,351 | 8/1995 | Horspool et al. | 341/51 |

*Primary Examiner*—Howard L. Williams
*Attorney, Agent, or Firm*—Mark M. Friedman

[57] ABSTRACT

A system for lossy compression of digital data for transmission to a remote location or to a storage medium and subsequently reconstructing the digital data includes an encoder which compares sequences of characters with an encoder database of data records to generate a compressed code. The compressed code includes pointer information relating to locations within the encoder database of data records corresponding within a given average distortion tolerance level per character to the sequences, and update information for the addition to the encoder database of new data records corresponding within the average distortion tolerance level per character to the sequences. The system also includes a decoder for receiving the compressed code, the receiver processing the compressed code to substantially reconstruct the digital data.

5 Claims, 4 Drawing Sheets

METHODS AND MEANS FOR IMAGE AND VOICE COMPRESSION

This application is a continuation of U.S. patent application Ser. No. 08/763,376 filed Dec. 13, 1999, now U.S. Pat. No. 5,836,003, which is a continuation-in-part of U.S. application Ser. No. 08/112,186, filed Aug. 26, 1993 now abandoned.

FIELD AND BACKGROUND OF THE INVENTION

Data compression is a general process of transforming a body of data to a smaller representation from which the original or some approximation to the original can be reconstructed. This process is called lossless compression if the original can be reconstructed; otherwise, it is called lossy compression of information. Although lossless data compression can be applied to any type of data, in practice, it is most appropriate for textual data, where it is typically important to preserve the original data. By contrast, lossy compression is most useful for digitized data such as voice, image, video, where some information may be lost since only the perceived quality of the reconstructed data is important. We study theory, methods and algorithms for lossy data compression in computer networks. This work is focused on algorithms design, bounds and performance analysis, mostly from the point of view of information theory.

1.1. DATA COMPRESSION

Efficient compression methods and algorithms are required in every modern information system. The development of communication systems is ever becoming more sophisticated. A vast increase in computational power is now available and is used within communication terminals to enhance performance. Now, however, electronics is cheap, but power and bandwidth in channels are resources to be conserved. The winning design of information system will be the design that transmits with lower power at higher rates and with fewer errors; greater hardware complexity is a penalty that can be accepted.

Recent advances in technology have made it practical to store and communicate high bandwidth analog data such as speech, still images and video in digital form. Digital communication provides flexibility, reliability, and cost effectiveness with the added advantage of communication privacy and security through encryption. Digital representation of analog data allows us to process these data more efficiently and effectively.

Lossless data compression works well for textual data but its performance in case of digitized data is rather limited. Lossy compression on the other hand can be designed to offer a wide range of compression rates at the expense of the quality of the reconstructed signal. The issue now becomes how to achieve a certain compression ratio while optimizing the signal quality, or vice versa, how to maintain a desired quality while minimizing the data rate, known also as D-semifaithful coding. However, compression is always achieved at the cost of computational resources.

The search for the ultimate limits on digital communication systems, and for methods that come close to these limits, is the main subject of this research. This work addresses practical and theoretical issues encountered in the lossy compression of information, including bounds, algorithm design, performance evaluation of various optimal and sub-optimal compression techniques and practical problems. A prime theoretical issue is the design and proof of convergence of the first and probably the only universal lossy data compression algorithms that attain the theoretical bound.

1.2. BASIC CONCEPTS

The mathematical basis for data compression is a branch in information theory called rate-distortion theory, which is devoted to the study of how much information can be transmitted through a limited channel capacity. The work of Shannon [Sh-48]is the foundation of modern information theory. For a comprehensive treatment of rate-distortion theory, see Berger [Be-71]and Gallagher [Ga-68].

Consider the block diagram model of a communication system depicted in FIG. 1. The aim of the communication is to convey the information generated by a sender or a source to a receiver. The channel is a physical medium that links the source and the receiver. A common channel would be a telephone line but in information storage and retrieval applications, the channel may be the storage medium. We will assume that the channel is error free, that is, the channel does not introduce error to the data transmitted through the channel. What is important is the maximum information rate we can transmit through the channel, or the channel capacity.

The encoder is a device that transforms the source output into a form that can be transmitted over the channel. Likewise, the decoder converts the channel output into a form that can be interpreted by the receiver. The input signal to the encoder and the output signal from the decoder may not be the same due to the limited capacity of the channel. In general, the higher the information rate, the lower the distortion. Rate-distortion theory is the study of the trade-off between the rate and distortion. The objective of the research is to gain enhanced insight into the theoretical and practical issues in lossy data compression.

We shall assume that the reader is familiar with lossless encoding (sometimes called data compaction). The mathematical basis is the formal definition of the entropy. Entropy was recognized to play a central role in ergodic theory by Kolmogorov [Kol-58]. The relationship of entropy to the number of typical sequences as expressed by the asymptotic equipartition property (AEP) was developed by Shannon [Sh-48]and McMillan [Mc-53], with later refinements by Breiman [Br-57], Huffman [Huf-52] gave a construction for a practical codes. Because his class of codes could asymptotically achieve the entropy, many thought the problem was closed. However, more recent work has given a large variety of codes from which users can choose according to their special needs. The modern lossless universal encoding algorithms are embodied principally by the works of Lempel and Ziv [LZ-77] and [LZ-78] and of Rissanen and Langdon [RiLa-81]. These works have many variants in literature. The performance of block codes was studied by Jelinek [Jel-68], Csiszar and Longo [CsLo-71], Fittingoff [Fi-66], Davisson [Da-73 ] and others.

1.3. SUMMARY OF THE INVENTION

First, we consider the problem of optimal rate coding of ergodic sources in the context of rate distortion theory. A new D-semifaithful block coding scheme is given. We obtain source compression block coding theorems for the general stationary ergodic case. We study two methods and algorithms of source encoding subject to a fidelity criterion for finite blocklength. The convergence of the compression ratio to the rate distortion function is proved. Issues of error probability and refined covering theorems are also addressed. Next we apply the D-semifaithful block coding scheme for discrete memoryless sources. An asymptotic theory of large deviations is applied to the compression problem of identically independent distributed (i.i.d) and Markov sources. Numerical methods based on linear programming are formulated for the asymptotic calculation of the error probability, $P_e(R,D,l)$, and the operational rate distortion blocklength function $\hat{R}(D,l)$, which is the minimal rate needed if an arbitrarily small part of sourcewords space is removed. All these expressions are calculated for finite blocklength l.

We then propose two practical universal source coding schemes based on approximate string matching. One is an approximate random length string matching data compression, and the other is (Lempel Ziv) LZ-type quasi parsing method by approximate string matching. It is shown that in the former algorithm the compression rate converges to the theoretical bound of R(D) for ergodic and stationary processes as the database size and the string length tend to infinity. A similar result holds for the latter algorithm in the limit of infinite database size. We evaluate the performance of the two algorithms in practical cases where database size is finite and where the string length is finite. In addition, we prove the duality between the two algorithms and prove some asymptotic properties concerning the workings of an approximate string matching algorithms for ergodic stationary sources.

Next, we consider practical issues such as the computational complexity of the algorithms and the definitions of alphabet and distortion in multimedia applications We consider an important and practical approximate design technique based on tree-structured database, which has added advantages of fast approximate string matching. Although the performance does not attain the bound of rate distortion function R(D). Heuristic algorithms are also addressed for intractable problems. Of special interest is the case of image compression. In video coding we know that the process is quasi-periodic in the following sense; an approximate match to a portion of the current frame that is now in motion will almost surely be found in the previous frame or two located in a spatially nearly position. It follows that it is not necessary to keep infinite database. A relatively small part of the past is sufficient for almost perfect encoding. Moreover, we use the limited resolution of the human eyes and ears. Thus, even for still images and voice records, by an appropriate definition of the distortion measure and alphabet, we obtain good compression while keeping a proper reconstructed image/voice record. Sometimes, we even gain enhancement and noise reduction where a-priori knowledge is available.

SOURCE COMPRESSION BLOCK CODING SUBJECT TO A FIDELITY CRITERION

We consider the problem of optimal rate coding of ergodic sources in the context of rate distortion theory. A new D-semi-faithful coding scheme is given. We obtain source compression block coding theorems for the general stationary ergodic case. We study two methods and algorithms of source encoding subject to a fidelity criterion for finite blocklength. The convergence of the compression ratio to the rate distortion function is proved. Issues of error probability and refined covering theorems are also addressed. An asymptotic theory of large deviations is applied to the compression problem of i.i.d and Markov sources. Numerical methods based on linear programming are formulated for the asymptotic calculation of the error probability, $P_e(R,D,l)$, and the operational rate distortion blocklength function $\hat{R}(D,l)$, which is the minimal rate needed if an arbitrarily small part of sourcewords space is removed. All these expressions are calculated for finite blocklength l.

2.1. BACKGROUND

The source produces a random sequence $\{U_k\}$ and the decoder presents a random sequence $\{V_k\}$ to the user. In general, the finite alphabet V can differ from the source alphabet U. For reference—any classical book in information theory. We repeat on some of the definitions and the general results as presented in [Sa-†\] and [Bl-87]. Given u and v a distortion—measure is any function $d:[U\times V]\to (0 . . . \infty)$ where $U\times V$ is the Cartesian product. The function d measures the distortion (cost, penalty, loss, etc.) suffered each time the source produces letters $u \in U$ and the user is presented with letters $v \in V$. Usually, the range is finite and without loss of generality: $\min d(\bar{u}_i, \bar{v}_i)=0$. Let $p(\bar{u}, \bar{v})$-denotes the distortion for a block—the average of the per letter distortions for the letters that comprise the block.

$$\rho(\bar{u}; \bar{v}) = \frac{1}{l}\sum_{i=1}^{l} d(\bar{u}_i; \bar{v}_i) \tag{1}$$

The pair $(\bar{u}_i, \bar{v}_i)$ denotes the letters at the i-position at the source and the user, respectively. The distortion is assumed to be context—independent or more simply—memoryless.

For our purposes, a source u is a stationary, ergodic process taking values in a fixed finite set U, called the source alphabet. The distortion level D will be fixed throughout this section.

The classical definition of R(D) is the minimum achievable rate of a code with average per-letter distortion D. The function R(D) measures the abridged information content at distortion D. The rate distortion function R(D) is given by the minimal mutual information per source symbol subject to the constraint on the average distortion. It is known [Be-71] that given source with known distribution, $$\lim_{l\to\infty} \inf_{\hat{Q}} \frac{1}{l} I_{\hat{Q}}(u_0^{l-1}, v_0^{l-1}) = R(D). \tag{2}$$

where the infimum with respect to $\hat{Q}$ is taken over all the joint distributions on $U^l \times V^l$ and having one l dimensional marginal and satisfying $$E_{\hat{Q}} \rho_l(\bar{u}, \bar{v}) \leq D. \tag{3}$$

Shannon's theorem shows [Be-71] that for ergodic sources, R(D) is the lowest attainable rate by any block code with average distortion not exceeding D.

We define the error probability $P_e(R,l,D)$ as the probability of a sourceword of blocklength l that cannot be encoded within maximum block distortion lD, or maximum average per-letter distortion D.

The existence of block-codes subject to a fidelity criterion has been proved under various assumptions on the class of sources, the fidelity criterion and the type of convergence of the rates to the rate distortion function. However, all of the schemes are impractical. The problem was studied by Ziv [Z-72], Neuhoff et al. [Ne-75], Kieffer [Ki-78], Ornstein and Shields [OS-90] and others. Our attitude to the problem is different in the sense that we consider it mainly as a deterministic partition problem on a bipartite graph. Unlike most of the known results in the subject which are based on random coding arguments Our results generalize known theorems in the lossless blockcoding to their lossy versions. The main results are generalizations of Shannon- McMillan-Breiman theorem and the asymptotic error bounds on the performance of block codes. This work extends the results of Davisson [Da-73] and Fittinghof [Fi-66] for universal codes for data compaction (the lossless case). Our results, also apply, virtually without change in proof, to random fields. These theorems are useful in proving convergence of universal source coding.

We discuss the simpler cases of Markov and i.i.d. sources and transform the problem to the stochastic problem. For the i.i.d. case (and Markov in a similar way) we prove and calculate the asymptotic expansion of the lowest attainable compression rate for a fixed blocklength l, while keeping arbitrarily small error probability, denoted $\hat{R}(D,l)$ and the asymptotic expansion of the error probability for large l.

The problem for i.i.d. sources was first introduced by Shannon [Sh-48]. He returned to the problem in 1959 when he introduced the study of performance measures for data compression and provided the first source compression coding theorems [Sh-59]. Strengthened versions of the coding theorems were proved by Berger [Be-71], Omutra [Om-73], Ziv [Z-72], Blahut [Bl-72] [Bl-74] and others. Arimoto [Ar-73] Dueck and Korner [DuKo-79] and Marton [Ma-74] proved the exponential decay of the error probability for memoryless sources. The general ergodic source compression was studied lately by Ornstein and Shields [OS-90].

We present an application and generalization of [KMST-85] method. Similar method was studied for the lossless case in [CoS-91]. The mathematical basis of the large deviations theory is described briefly in in this work, whereas the complete proofs and development are described in our paper [Sa].

To summarize, the aims of this section are:
1. To present algorithms for optimal block-coding compression where the source probabilities are known and theorems proving convergence and performance analysis.
2. To present a procedure based on linear programming to obtain the full asymptotic expansion of $P_e(R,D,l)$—the error probability in the i.i.d. case (and Markov).
3. To describe a procedure based on linear programming to find the operational rate distortion blocklength function R(D,l) for i.i.d. (and Markovian) sources.
4. To show the possible application of the large deviations theory in information theory, and in particular the asymptotic density of the empirical distribution and its derivatives.

The section is organized as follows, section 2.2 presents definitions, algorithms and a summary of source compression coding theorems for the general ergodic sources. Section 2.3 presents the general result of large deviation theory, while section 2.4 presents the application to the empirical distribution and its derivatives such as the average information. Section 2.5 presents the results concerning data compression of i.i.d. (and Markov) sources where all aspects of the subject are studied for finite blocklength. In section 2.6 we give a short summary and discussion on future research directions.

2.2. DESCRIPTION OF THE PREFERRED EMBODIMENTS

Figure 1:
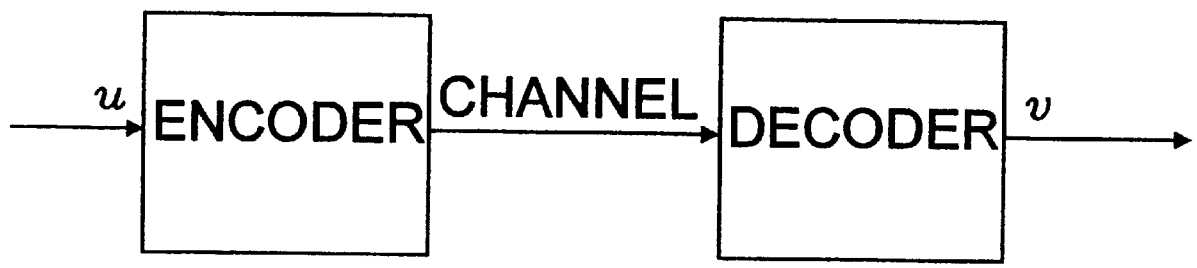
FIG. 1 schematically depicts a block diagram of a communication system.

We treat first the classical case of a single source being transmitted to a single user with tolerable distortion at a specified rate. The source produces a random sequence $\{U_k\}$ and the decoder presents a random sequence $\{V_k\}$ to the user. In general, the finite alphabet V can differ from the source alphabet U. For reference—any classical book in Information Theory. [Bl-85].

Given u and v a distortion measure is any function $d:[U \times V] \to (0 \ldots \infty)$ where $U \times V$ is the Cartesian product. The function d measures the distortion (cost, penalty, loss, etc.) suffered each time the source produces letters $u \in U$ and the user is presented with letters $v \in V$. Usually, the range is finite and without loss of generality: $\min d(\bar{u}_i, \bar{v}_i)=0$. Let $p(\bar{u}; \bar{v})$—denotes the distortion for a block—the average of the per letter distortions for the letters that comprise the block.

$$\rho_l(\bar{u}; \bar{v}) = \frac{1}{l}\sum_{i=1}^{l} d(\bar{u}_i; \bar{v}_i) \qquad (4)$$

The pair $(\bar{u}_i;\bar{v}_i)$ denotes the letters at the i-position at the source and the user, respectively. The distortion is assumed to be context—independent or more simply—memoryless.

The rate-distortion function R(D) is a generalization of the concept of entropy. Let D be a given tolerable level of expected distortion relative to the memoryless distortion measure d(u,v). R(D) is the minimum achievable rate of a code with average per-letter distortion D. The function R(D) measures the abridged information content at distortion D. The rate distortion function R(D) is given by the minimal mutual information per source symbol subject to the constraint on the average distortion. It is known [Be-71] that given a source with distribution p, $$\lim_{l \to \infty} \inf_{\hat{Q}} \frac{1}{l} I_{\hat{Q}}(u_0^{l-1}, v_0^{l-1}) = R(D). \qquad (5)$$

where the infimum with respect to $\hat{Q}$ is taken over all the joint distributions on $U^l \times V^l$ and having one l dimensional marginal and satisfying $$E_{\hat{Q}} \rho_l(\bar{u}; \bar{v}) \leq D. \qquad (6)$$

Shannon's theorem shows [Be-71] that the ergodic sources, R(D) is the lowest attainable rate by any block code with average distortion not exceeding D.

The function R(D) has been intensively studied, although it is not known explicitly, Some of its properties are:
1. It is convex U shape.
2. The minimum defining it—is achieved by at least one choice of V for every $D \geq 0$.
3. R'(D) is continuous for $0 < D < D_{max}$.
4. R'(D)$\to -\infty$ as $D \to 0$.
5. R'(D) is monotonic decreasing.

The value of R(D) is the effective rate at which the source produces information subject to the requirement that the source output must be reproduced with an expected average distortion not exceeding the value D. The following theorems establishes these relations.

The deterministic partition approach.

The set of all possible codewords is partitioned into two disjoint subsets: Codebook and its complement set. The Codebook contains all the codewords in the code. Each sourceword $\bar{u}$ of length l is mapped onto exactly one of the codewords in the Codebook provided the distortion of the block is not larger than lD. Otherwise, the sourceword is included in the Error set and a coding failure is said to occur.

First we apply a deterministic partition to the sourcewords space and on the codewords. The partition algorithm described here assumes a fixed l and for a source with known probability structure $p^1$ defined on $U^1$. First we define D-Ball cover on the sourcewords space.

DEFINITION 1: A covering of a codeword $\bar{v}$, denoted $Y(\bar{v})$, is a set of all sourcewords such that $$Y(\bar{v}) = \{\bar{u} | p1(\bar{u},\bar{v}) \leq D\}. \tag{7}$$

That is, we define spheres around all the possible codewords $\bar{v}$. But these spheres do not define probabilities on the codewords. Each sourceword should be mapped to at most one codeword. Thus, we denote the set of the sourcewords that map to the codeword $\bar{v}$ after a partition, as $A(\bar{v})$. Clearly $A(\bar{v}) \subseteq Y(\bar{v})$. We construct a partition such that for all $m \leq |V|^l$ the subsets $A(\bar{v}^m)$ form a full partition of the set of all sourcewords. The probability of each codeword $\bar{v}$ is defined as the probability of the set $A(\bar{v})$. Obviously, the entropy of the output process v $H_v(l)$ for all l, is also defined by the partition since the partition induces probabilities on the codewords, $Pr(\bar{v}^j) = Pr(A(\bar{v}^j))$ for all j. The following properties are required as a sorted list of codewords, $$A(\bar{v}^j) \cap A(\bar{v}^m) = \emptyset, \forall j \neq m$$

$$Pr(\bar{v}^j) = Pr(A(\bar{v}^j)) \geq Pr(\bar{v}^m) = Pr(A(\bar{v}^m)), \forall j < m$$

DEFINITION 2: An acceptable partition is a partition on the sourcewords space such that for all $\bar{v}$, the subset $A(\bar{v})$ satisfies $A(\bar{v}) \subseteq Y(\bar{v})$.

For each blocklength l, an acceptable average distortion D and a rate R, and a given acceptable partition, the choice of the most probable codewords minimizes the error probability over all possible codebooks. By defining the rate R we have to select the most probable codewords for the codebook, such that the size of the codebook is exp(lR). Thus, the probability of the Codebook is maximized or equivalently the probability of the Error set is minimized. That is because the Error set consists all the sourcewords that are not mapped into the Codebook.

We define for an acceptable partition algorithm $$\lim_{l \to \infty} H_v(l) = H_v \tag{8}$$

DEFINITION 3: The rate distortion blocklength function R(D,l) is the minimal entropy, in the class of all entropies induced by acceptable partitions for a fixed l.

THEOREM 1:

For an ergodic process u the minimal entropy over the class of all acceptable partitions converges almost surely to the rate distortion function R(D), as l tends to infinity.

Proof: Recall that R(D) is the minimum achievable rate of a code with average per-letter distortion D. It is known [Be-71] that given a source with distribution $p^1$, $$\lim_{l \to \infty} \inf_{\hat{Q}} \frac{1}{l} I_{\hat{Q}}(u^l, v^l) = R(D). \tag{9}$$

for all l blocks, where the infimum is taken over all the joint distributions $\hat{Q}$ on $U^1 \times V^1$ which have the 1 dimensional marginal distribution $p^1$ on $U^1$ and satisfying $$E_{\hat{Q}} \rho_l(\bar{u}, \bar{v}) \leq D. \tag{10}$$

The transition matrix is defined on the ergodic process as $$\hat{Q}(\hat{v} | \hat{u}) = \tag{11}$$

$$\lim_{n \to \infty} \frac{1}{n} \sum_{k=1}^{n} \Pr\{v_{kl}^{(k+1)l-1} = \bar{v} | u_{kl}^{(k+1)l-1} = \bar{u}\} \quad \forall (\bar{u}; \bar{v}) \in U^l \times V^l$$

and the mutual information defined on the two processes is, $$I_{\hat{Q}}(u^l, v^l) = \lim_{n \to \infty} \frac{1}{n} I(u_1^{nl}; v_1^{nl}).$$

Next we show that the entropy of the codewords $H_u(l)$ is equal to the mutual information. That is because $H(\bar{v})(\bar{u})=0$, as the partition is a deterministic procedure provided the distribution of the source is known. The assignment of a codeword in each step has the transition probability of a l block $\bar{v}$ given a block $\bar{u}$, $$\Pr\{v_{kl}^{(k+1)l-1} = \bar{v} | u_{kl}^{(k+1)l-1} = \bar{u}\}$$

which is a matrix whose entries are (0;1), for all k. Hence, $$H\{v_{kl}^{(k+1)l-1} | u_{kl}^{(k+1)l-1}\} = 0$$

for all k. This holds for all l-length segments, so that the whole transition from a process u to a process v has zero uncertainty provided the distribution of the input is known. That is H(v|u)=0. Therefore the transformation of the process u is described by the limit transition matrix $\hat{Q}$ such that $H_{\hat{Q}}(v|u)=0$.

Define the set of all output processes v generated by l length sequences $\bar{v}$ reproduced by the input sequence u of l length strings $\bar{u}$. We assume that the distribution of u on the string $p^1$ is known and the deterministic encoder-decoder pair is represented by $\hat{Q}$. Hence, $$V(p, \hat{Q}) = \{v : H\{v_{kl}^{(k+1)l-1} | u_{kl}^{(k+1)l-1}\} = 0 \quad \forall k.\} \tag{12}$$

That is, because there is no randomness in the assignment of a block $\bar{v}$ to $\bar{u}$. The assignment of the encoder-decoder pair imposes the constraint that the conditional entropy of the block $\bar{v}$ given the $\bar{u}$ vanishes for each block. That is $H(\bar{v}|\bar{u})=0$. Recall that the mutual information is defined as, $I(\bar{u}, \bar{v})=H(\bar{v})-H(\bar{v}|\bar{u})$. The process v is a deterministic concatenation of outputs $\bar{v}$ of the blockcoding. Hence, H(v|u)=0 and I(u, v)=H(v).

We define the entropy rate of the process v as $H_{\hat{Q}}(v^1)$. Each iteration of the block encoding and decoding is completely independent with its neighbors or other blocks.

Hence we consider the events as independent. Since the process v is generated by independent events, where each block is uniquely determined by the corresponding l length defined on the process u, we obtain the equation, $$H_{\hat{Q}}(v^l) = \lim_{n \to \infty} \frac{1}{n} \sum_{k=1}^{n} H\{v_{kl}^{(k+1)l-1}\}. \qquad (13)$$

Clearly, the minimization of each l block entropy minimizes the overall entropy rate $$H_{\hat{Q}}(v^l)$$

defined on the process v. Conversely, the minimization of the entropy of the whole process v implies the minimization of the entropy defined on each l block, since all entropies are non negative.

The partition is such that the set assigned to each codeword is limited by the D-Ball covering $Y(\bar{v})$. The covering definition (7) imposes the following constraints for all k, $$\rho_l(u_{kl}^{(k+1)l-1}; v_{kl}^{(k+1)l-1}) \leq D$$

and consequently, $$\lim_{n \to \infty} \frac{1}{n} \sum_{k=1}^{n} \rho_l(u_{kl}^{(k+1)l-1}; v_{kl}^{(k+1)l-1}) \leq D.$$

Due to the ergodicity of the source and the law of large numbers, it is almost sure that, $$\lim_{n \to \infty} \frac{1}{n} \sum_{k=1}^{n} \rho_l(u_{kl}^{(k+1)l-1}; v_{kl}^{(k+1)l-1}) = E_{\hat{Q}} \rho_l(u^l; v^l). \qquad (14)$$

The minimization of the entropy over the class of all deterministic encoder-decoder pairs is equivalent to the minimization of the mutual information with respect to $\hat{Q}$ over all possible transition matrices while keeping the fidelity constraint, $$\lim_{l \to \infty} \inf_{\hat{Q}: E_{\hat{Q}} \rho_l(u,v) \leq D} \inf_{v \in V(\rho, \hat{Q})} \frac{1}{l} \{H_{\hat{Q}}(v^l)\} = \qquad (15)$$

$$\lim_{l \to \infty} \inf_{\hat{Q}: E_{\hat{Q}} \rho_l(u,v) \leq D} \frac{1}{l} \{I_{\hat{Q}}(u^l; v^l)\} = R(D).$$

Minimization of the mutual information over the set of all matrices that satisfy (10) is equivalent to minimization of the output entropy over all acceptable partitions in each iteration. The constraints on the set of sourcewords associated to each codeword agrees with the fidelity criterion. As the blocklength l tends to infinity the constraint (7) is expressed in terms of expected values (14) and the infimum over all acceptable distributions is equivalent to the minimum over all acceptable partitions.

It is the best compression ratio one can reach asymptotically on the average with block codes (and also variable length codes [OS-90] on the entire space. It is known that in the stationary case it is sufficient to calculate the expected distortion per a single pair, and not for the whole l block. However, our definition is valid for the more general ergodic case.

The relations between the rate, distortion and blocklength has also an alternative definition. The following definition is an extension of [OS-90] definition.

DEFINITION 4:

The operational rate distortion blocklength denoted $\hat{R}(D, l)$ is the minimal rate, $\hat{R}_l(D, P_e)$, needed to cover with D-Balls a subset of sourcewords of probability $1-P_e$ in the limit case as $P_e$ is taken arbitrarily small with l big enough. Actually, they have defined the operational rate distortion function as, $$\hat{R}(D) = \lim_{P_e \to 0} \lim_{l \to \infty} \hat{R}_l(D, P_e) \qquad (16)$$

That is, the best one can do on the average with block codes if an arbitrarily small part of the sourcewords space is removed.

Ornstein and Shields [OS-90] proved almost sure convergence for Hamming distance. That is almost sure $\hat{R}(D)=R(D)$. Their proof is true in principal for other distortion measure as well. In general there is not an equality between $R(D,l)$ and $\hat{R}(D,l)$. Their difference vanishes only for large l.

DEFINITION 5:

The set D-Ball($\bar{u}$) is the covering on the codewords space such that, $$D - Ball(\bar{u}) = \{\bar{v} \mid \rho_l(\bar{u}, \bar{v}) \leq D\}. \qquad (17)$$

THEOREM 2:

For any acceptable partition and given any $\delta > 0$, we can choose a blocklength l big enough so that the set of all possible sourcewords of blocklength l produced by the source can be partitioned to two sets, Error and Error$^c$, for which the following statements hold:

1. The probability of a sourceword belonging to Error, vanishes as l tends to infinity.
2. If a sourceword $\bar{u}$ is in Error$^c$ then its corresponding codeword $\bar{v}$ is in the Codebook and its probability of occurrence is more than $e^{-l(H_v(l)+\delta)}$.
3. The number of codewords in the Codebook is at most $e^{l(H_u(l)+\delta)}$.

Proof: We choose for the Codebook all the most probable codewords as produced by the partition algorithm.

The partition algorithm induces the probabilities that are assigned to each codeword. Recall that $$-\frac{1}{l} E \log \Pr(\bar{v}) = H_v(l). \qquad (18)$$

We define a certain threshold probability $p_t$ such that all codewords in the Codebook have higher probability that $p_t$. The Codebook set is defined by, $$\Gamma_l = \{\bar{v} \mid Pr(\bar{v}) \geq p_t\} \qquad (19)$$

and its cardinality is denoted $$|\Gamma_l(\delta, D)| e^{-l(H_v(l)+\delta)} \leq 1.$$

We choose $p_t$ such that $\delta = -\log p_t/l - H_v(l)$ where $H_v(l)$ is the entropy of the process v as determined by the partition algorithm. Thus, the requirements of statement 2 are satisfied and the Codebook set is defined by, $$\Gamma_l(D, \delta) = \{\bar{v} \mid \Pr(\bar{v}) \geq \exp(-l(H_v(l) + \delta))\} \quad (20)$$

Clearly, $$|\Gamma_l|.$$

Thus statement 3 holds.

An error occurs in the event that a D-Ball around a sourceword $\bar{u}$ does not contain any word from the selected codebook. That is, $$Error(\delta, D) = \left\{\bar{u} \mid \max_{\bar{v}:\rho(\bar{u},\bar{v}) \leq D} \Pr(\bar{v}) < p_l\right\} \quad (21)$$

or $$Error(\delta, D) = \left\{\bar{u} \mid \min_{\bar{v}:\rho(\bar{u},\bar{v}) \leq D} -\frac{1}{l}\log\Pr(\bar{v}) - H_v(l) \geq \delta\right\} \quad (22)$$

Since the partition on the sourcewords, $$\Pr\{Error(\delta, D)\} = \Pr\left\{\bar{v} \mid -\frac{1}{l}\log\Pr(\bar{v}) - H_v(l) \geq \delta\right\} \quad (23)$$

We use the Breiman refinement of the Shannon-McMillan theorem [Br-57] which asserts that, $$\Pr\left\{\lim_{l\to\infty} -\frac{1}{l}\log\Pr(\bar{v}) = H_v\right\} = 1. \quad (24)$$

The convergence almost to the entropy implies that the Error set (21) (22) has measure that tends to zero for all positive $\delta$ as $l\to\infty$. □

THEOREM 3:

For an acceptable partition algorithm that attains the minimal entropy $R(D,l)$ and given any $\delta>0$, we can choose a blocklength $l$ big enough so that the set of all possible sourcewords of blocklength $l$ produced by the source can be partitioned to two sets Error and Error$^c$ for which the following statements hold:

1. The probability of a sourceword belonging to Error, denoted $P_e(D,l,\delta)$, vanishes as $l$ tends to infinity.
2. If a sourceword $\bar{u}$ is in Error$^c$ then its corresponding codeword $\bar{v}$ is in the Codebook and its probability of occurrence is more than $e^{-l(R(D,l)+\delta)}$.
3. The number of codewords in the Codebook is at most $e^{l(R(D,l)+\delta)}$.

Proof: We have a special case of the previous theorem. Recall that for the optimal acceptable partition, $$-\frac{1}{l}E\log\Pr(\bar{v}) = R(D, l) \quad (25)$$

The results follow immediately from Th. 2. □

A result of Theorem 3 establishes a basis for universal source coding as will be presented in chapter 3.

THEOREM 4:

For any acceptable partition algorithm inducing probabilities and entropy $H_v(l)$ on codewords and given any $\delta>0$, it is possible to select for the Codebook codewords with probability greater than $e^{-l(H_v(l)+\delta)}$, $$\Pr\{Error_l(\delta, D)\} \leq \inf_{a:a>o}\left\{\exp - s(H_v(l) + \delta)\sum_{\bar{v}} \Pr(\bar{v})^{1-\frac{s}{l}}\right\} \quad (26)$$

Proof:

An error occurs in the event that a D-Ball around a l-length sourceword $\bar{u}$ does not contain any word from the selected codebook. That is, $$Error_l(\delta, D) = \left\{\bar{u} \mid \min_{\bar{v}:\rho(\bar{u},\bar{v}) \leq D} -\frac{1}{l}\log\Pr(\bar{v}) - H_v(l) \geq \delta\right\} \quad (27)$$

$$\Pr\{Error_l(\delta, D)\} = \Pr\left\{\bar{v} \mid -\frac{1}{l}\log\Pr(\bar{v}) - H_v(l) \geq \delta\right\} \quad (28)$$

We use the Chernoff bound that yields, $$\Pr\{Error_l(\delta, D)\} = \quad (29)$$

$$\Pr\left\{\bar{v} \mid -\frac{1}{l}\log\Pr(\bar{v}) \geq H_v(l) + \delta\right\} \leq \exp - s(H_v(l) + \delta)\sum_{\bar{v}} \Pr(\bar{v})^{1-\frac{s}{l}}$$

for all s greater than zero. Thus the inequality is valid also in the worst case. That is, $$\Pr\{Error_l(\delta, D)\} \leq \inf_{s>o}\left\{\exp - s(H_v(l) + \delta)\sum_{\bar{v}} \Pr(\bar{v})^{1-\frac{s}{l}}\right\} \square \quad (30)$$

THEOREM 5:

For the optimal partition algorithm inducing probabilities and the minimal entropy $R(D,l)$ on code-words and given any $\delta>0$, it is possible to select for the Codebook codewords with probability greater than $e^{-l(R(D,l)+\delta)}$, such that the error probability denoted $P_e(\delta,D,l)$ satisfies, $$P_e(\delta, D, l) \leq \inf_{s>o}\left\{\exp - s(R(D, l) + \delta)\sum_{\bar{v}} \Pr(\bar{v})^{1-\frac{s}{l}}\right\}. \quad (31)$$

Proof: A direct consequence from previous theorem as $H_v(l)=R(D,l)$. □

Theorem 6:

Given is a stationary ergodic source u with known probabilities for all blocklength $\iota$, an acceptable average distortion D and a rate R. Then for each blocklength $\iota$ the following statements hold, 1. The optimal code set, namely "the codebook", is the set of codewords as defined by:

$$\Gamma_\iota(D,\delta) = \{\bar{v} \mid \Pr(\bar{v}) \geq e^{-\iota(R(D,\iota)+\delta(R,D,\iota))}\} \quad (32)$$

and the value $\delta=\delta(\iota,D,R)$, is determined such that, $|\Gamma_\iota(D,\delta)|=S=\exp(\iota R)$.

2. The error set is defined by, $$Error_l(\delta, D) = \left\{\bar{u} \mid \min_{\bar{v}:\rho(\bar{u},\bar{v}) \leq D} -\frac{1}{l}\log\Pr(\bar{v}) - R(D, l) > \delta(R, D, l)\right\}. \quad (33)$$

3. The partition that achieves the minimal entropy $(R(D,\iota))$ induces probabilities on codewords such that the error probability $P_e(R,D,\iota)$ is minimal for big enough $\iota$. The limit satisfies $$P_e(R, D) \le \lim_{l\to\infty} \inf_{a:a>0} \left\{ e^{-a(R(D,l)+\delta(R,D,l))} \sum_{\overline{v}} \Pr(\overline{v})^{1-\frac{s}{l}} \right\}. \quad (34)$$

Proof:

The optimal partition algorithm induces the probabilities that are assigned to each codeword such that the entropy is minimized. It is known for Shannon—McMillan—Breiman theorem that given an ergodic stationary process $\upsilon$ of entropy $H_\upsilon$ and any $\epsilon > 0$, we can choose blocklength $\iota$ big enough so that the set of all possible codewords of blocklength $\iota$ can be partitioned into two sets, the codebook $\Gamma$ and its complement $\Gamma^e$, for which the following statements hold:

1. The probability of a codeword belonging to $\Gamma^e$, which is the error probability, is less than $\epsilon$.
2. For any acceptable partition, $$\Pr\left\{ \lim_{l\to\infty} -\frac{1}{l} \log \Pr(\overline{v}) = H_v \right\} = 1. \quad (35)$$

Thus, choosing partition that minimizes the entropy, such that $H_\upsilon = R(D)$, is equivalent, for $\iota$ big enough, to minimizing the probability of error. The limit (34) is accepted from (26) as $\iota$ tends to infinity. Hence, statement 3 is proved.

The encoding procedure has to select the most probable codewords for the codebook. The size of the codebook is determined by the given rate R as $S = \exp(\iota R)$. Thus, we define a certain threshold probability $p_t$ such that all S codewords have higher probability than $p_t$ and the size of the set is S.

$$\Gamma_\iota = \overline{v} | \Pr(\overline{v}) \ge p_t \quad (36)$$

and the cardinality of the set is $|\Gamma_\iota| = S = \exp(\iota R)$. We define $\delta$ such that $\delta = -\log p_t/\iota - R(D,\iota)$ where $R(D,\iota)$ is the minimal entropy of the process $\upsilon$ as determined by the partition. Thus, $\delta$ defines the code to consist all codewords such that, $$\Gamma_\iota(R,D) = \{\overline{v} | \Pr(\overline{v}) \ge e^{-\iota(R(D,\iota)+\delta(R,\iota,D))}\} \quad (37)$$

The value $\delta = \delta(D,\iota,R)$ is determined such that, $|\Gamma_\iota(D,R)| = S = \exp(\iota R)$. By definition the error event is described by, $$Error(R, l, D) = \left\{ \overline{u} \;\middle|\; \max_{\overline{u}:\rho(\overline{u},\overline{v}) \le D} \Pr(\overline{v}) < p_t \right\} \quad (38)$$

or $$Error(R, l, D) = \left\{ \overline{u} \;\middle|\; \min_{\overline{v}:\rho(\overline{u},\overline{v}) \le D} -\frac{1}{l} \log \Pr(\overline{v}) - R(D, l) \ge \delta(R, D, l) \right\}. \quad (39)$$

with the same $\delta$. □

Algorithms:

The resulting blockcoding for the ergodic case are known mainly on the theoretical basis. It was established by Kieffer [Ki-78] that for the class of the ergodic sources with a given finite alphabet U, there is a sequence of D—semi-faithful codes such that for each ergodic process u the compression factor converges in $L^1$-norm to $R(D)$. But the first algorithm that implement it, was introduced by Ornstein and Shields [OS-90], although it is not practical at all. The blockcoding algorithm assumes the knowledge of the source distribution. They claim in their paper to have an extension of the Ziv-Lempel result to obtain almost sure convergence for the semi-faithful case. We do not accept that claim, since the algorithm is based on the assumption that the source distribution is known. However, we present here an extension of their algorithm.

The coding is a deterministic process which maps each sourceword to exactly one codeword. We construct an algorithm that defines this mapping. The following partition is a greedy algorithm that attains the operational rate distortion blocklength function $\hat{R}(D,\iota)$ and the converges to the optimal compression ratio $R(D)$ with probability one. The proof is identical to that of Ornstein Shields [OS-90] with the appropriate changes of a general distortion measure and general alphabets. Their proof was given for binary output alphabet and Hamming distance. However, the proof is the same.

Denote the set of the sourcewords that map to the codeword $\overline{v}$ as $A(\overline{v})$. Clearly $A(\overline{v}) \subseteq Y(\overline{v})$. In each step we create the the most probable subset which is mutually exclusive with all the sets already selected. Here $\overline{v}^j$ denotes the j-th codeword in the list.

Scheme A:

Initialize:

1. Define $Y(\overline{v})$ for all the possible codewords.
2. M=1
3. Define $A(\overline{v}) = Y(\overline{v}) \forall \overline{v}$.

Loop:

4. Find the index k, k>m which satisfies $$Pr(A(\overline{v}^k)) = \max_{j \ge m} Pr(A(\overline{v}^j)).$$

5. Swap $\overline{v}^\pi, \overline{v}^k$.
6. Update all the remaining subsets $$A(\overline{v}^j) = A(\overline{v}^j) - A(\overline{v}^j) \cap A(\overline{v}^m), \forall j > m$$

7. m=m+1.
8. If $m \le |V|^\iota$ then goto Loop, else stop.

After the algorithm is executed, all the codewords are sorted such that to each codeword we assign the set of sourcewords mapped to it. The probability of each codeword is defined to be the probability of the set of sourcewords assigned to it.

$$(\Pr(\overline{v}^m) = \Pr(A(\overline{v}^m)))$$

Then, the subsets $A(\overline{v}^m)$ for a full partition of the set of all sourcewords. We select for the codebook the most probable codewords as specified by the rate R. That is $e^{\iota R}$ codewords. Actually, it is possible to stop the algorithm after $d^{\iota R}$ steps. It is clear the after the execution of the algorithm the following properties are valid, $$A(\overline{v}^j) \cap A(\overline{v}^m) = \emptyset, \forall j \ne m$$

$$\Pr(A(\overline{v}^j)) \ge \Pr(A(\overline{v}^m)), \forall j < m$$

$$\Pr(\overline{v}^j) \ge \Pr(\overline{v}^m), \forall j < m.$$

Next, we propose the following algorithm for optimal blockcoding based on finding the partition which minimizes the entropy.

Scheme B:

1. Find the acceptable partition that minimizes the entropy induced on the codewords process $\upsilon$ for blocklength $\iota$.

2. Choose for the Codebook the most probable codewords. The size of the Codebook is defined by the given rate R.

We have proved that the algorithm attains the rate distortion blocklength function R(D,ι) and almost surely converges to the bound R(D). It also minimizes the error probability for large enough blocklength ι. The problem is in the implementation of such algorithm. It is extremely complex. But, the algorithm and the proofs related to it are highly important for the proof of the optimality of our new universal source coding methods.

To summarize, blockcoding for finite length ι has its theoretical merits, but it is not practical at all. In general, all the algorithms are NP problems in the sense that they require scanning of an exponentially large class of codes, to find one which performs best for this block. Moreover, the assumption of knowing the source statistics is not practical and therefore all these methods are practically useless.

It is known [OS-90] that the rate distortion function R(D) is also the best one can do asymptotically on the average with block codes or variable-length codes on the entire space. Hence, our results for the finite length block coding are valid for the variable length codes as well.

2.3. AN ASYMPTOTIC THEORY OF LARGE DEVIATIONS

Let
$_n$be K-dimensional mean of i.i.d. $Z_n$ such that, $$X_n = \frac{1}{n}\sum_{i=1}^{n} Z_i \quad (40)$$

where
$_n$is a zero mean K-dimensional i.i.d. whose p.d.f. is $$\frac{\partial^K}{\partial z_1 \ldots \partial z_K}\Pr\{Z_n \le z\} = w(z). \quad (41)$$

We are interested at the evaluation of the probability density function, for large n:

$$p(y, n) = \frac{\partial^K}{\partial y_1 \ldots \partial y_K}\Pr\{X_n \le y\}. \quad (42)$$

In this section, we present the main results of the one dimensional theory of [KMST 85] and its generalization to higher dimensions in [Sa-*]. Following [KMST-85] Method we construct an approximation to $p(\bar{y},n)$ for n>>1.

$$p(y, n) \sim \sqrt{n}^{-K}\exp(-n\Psi(y))(K_0(y) + K_1(y)/n + \ldots) \quad (43)$$

M(θ) is the moment generating function of $Z_n$ $$M(\theta) = \int_{-\infty}^{+\infty} \ldots \int_{-\infty}^{+\infty} [\exp(\theta \cdot z)w(z)]dz_1 \ldots dz_K. \quad (44.a)$$

It is known that $$\Psi(y)=y\cdot\nabla\Psi(y)-\log M(\nabla\Psi(y)) \quad (44.b)$$

Which is equivalent to:

$$\Psi(y) = \sup_{\theta}(\theta \cdot y - \log M(\theta)) \quad (44.c)$$

It is sufficient to compute $K_0(y)$ for almost all practical applications. We have shown in [Sa-*] that the approximated density function is:

$$p(\bar{y}, n) \approx (2\pi/n)^{-K/2} \cdot \sqrt{\det C(\bar{y})} \cdot \exp\{-n \cdot \Psi(\bar{y})\} \quad (45)$$

where $$C_{i,j}(y) = \frac{\partial^2 \Psi(y)}{\partial y_i \partial y_j}. \quad (46)$$

2.4. THE EMPIRICAL DISTRIBUTION AND THE INFORMATION

We apply the large deviations theory to the memoryless source case. The probability p(u) is the a-priori probability of a source letter u taken from U defined as the source alphabet.

Definition 6: The notation $\bar{u}$ denotes a word in $U^\iota$ and N(u; $\bar{u}$) is the number of indices k∈[1 . . . ι] such that $\bar{u}_k$=u. That is, the number of occurrences of the letter u in the vector $\bar{u}$= $\bar{u}_1 \ldots \bar{u}_\iota$.

Definition 7: The random vector $X_\iota(\bar{u})$ defined the deviations of the empirical distribution from the probability measure p.

$$X_l(\bar{u}) = \left\{\left(\frac{N(u_1,\bar{u})}{l} - p(u_1)\right); \ldots ; \left(\frac{N(u_{N-1},\bar{u})}{l} - p(u_{N-1})\right)\right\} \quad (47)$$

with K=N−1=|U|−1 components.

Corollary:

Under the assumptions that the source is stationary and memoryless—the random vector $X_\iota(\bar{u})$ is a large deviations process with K=N−1 random variables, satisfying $$X_l = \frac{1}{l}\sum_{i=1}^{l} Z_i$$

where the random vector $Z_\iota$ is a sequence of zero mean, i.i.d. K-dim random variable, such that Pr $(Z_\iota=\bar{e}_i-p)=p_i$. Thus, following (41), its density function·w(z) is defined by $$w(z) = \Pr\{Z_l = z\} = \sum_{i=1}^{K} p_i \cdot \delta(\bar{e}_i - \bar{p} - \bar{z}) \quad (48)$$

where $\bar{e}_i$ is a unit vector at the i-th index and $\bar{p}$ is the vector of the a-priori probabilities.

Corollary:

The result can be applied directly in a straightforward manner to the jointly pair or triples sequences and higher dimensions. We define the deviation from the joint distribution, $$X_i(\bar{u}, \bar{v}) =$$

-continued $$\left\{\left(\frac{N(u_1, v_1; \bar{u}, \bar{v})}{l} - p(u_1, v_1)\right)\ldots\left(\frac{N(u_N, v_{M-1}; \bar{u}, \bar{v})}{l} - p(u_N, v_{M-1})\right)\right\}$$

$$\forall (u, v) \in U \times V - \{u_N, v_M\}$$

where $\bar{p}=(p(u_1,v_1) \ldots p(u_N,v_{M-1}))$. Following (41) we obtain the density function, $$w(\bar{z}) = \sum_{k=1}^{N*M-1=K} p_k \cdot \delta(\bar{e}_k - \bar{p} - \bar{z})$$

Without loss of generality we have omitted the last component (N,M) to construct $K=N*M-1$ random variables. Obviously, the K components are mutually dependent. This vector is defined in the sample space $R^K$.

Definition 8: Given a memoryless source with entropy H and sequences of blocklength $\iota$ and we define the deviation of the information from entropy as the iid random variables-$\tau_i$ $(u_i)=-\log p(u_i)-H$ $i=1 \ldots \iota$.

The sample mean of the deviations from the entropy is denoted by $$X_l^w(\bar{u}) = \frac{1}{l} \cdot \sum_{i=1}^{l}(-\log p(u_i) - H) \quad (49.a)$$

It is clear that $E(X_\iota^w)=0$. It yields the following result.

Corollary:

Following (41), the probability density function of the deviation of the average information is:

$$w(z) = \sum_{i=1}^{|U|} p_i - \delta(-\log p_i - H - z). \quad (49.b)$$

Corollary:

We show that the random variable associated to the weakly typical sequences, can be easily derived from the distribution of the empirical distribution for memoryless sources. That is because $$Pr(\bar{u}) = \prod_{1}^{N}(p(u_1))^{N(u_1,\bar{u})} \ldots (p(u_N))^{N(u_N,\bar{u})},$$

we have from (49.a) that, $$X_l^w(\bar{u}) =$$

$$-\sum_{1}^{N}\log p(u_1)\left(\frac{N(u_1, \bar{u})}{l} - p(u_1)\right) + \ldots + \log p(u_N)\left(\frac{N(u_N, \bar{u})}{l} - p(u_N)\right)$$

Denoting the vector of constants, $$\bar{f}_i = \log\frac{p(u_i)}{p(u_N)} \quad i=1 \ldots K = N-1 \quad (50)$$

We find that $$X_\iota^w(\bar{u}) = -X_\iota(\bar{u}) \cdot \bar{f} \quad (51)$$

Corollary:

We present here the appropriate terms in the general large deviations distribution function, that identify the distribution of the deviations of the empirical distribution. That is following (45), $$p(\bar{y}, l) = \frac{\partial^K}{\partial y_1 \ldots \partial y_K} \Pr\{X_l(\bar{u}) \le \bar{y}\} = \quad (52.a)$$

$$(2\pi/l)^{-K/2} \cdot \sqrt{\det C(\bar{y})} \cdot \exp\{-l \cdot \Psi(\bar{y})\}$$

where:

$$\Psi(\bar{y}) = \sup_{\bar{\theta}}(\bar{\theta} \cdot \bar{y} - \log M(\bar{\theta}))$$

Setting $\bar{p}=(p(u_1) \ldots p(u_{N-1}))$ We have, $$M(\bar{\theta}) = \exp(-\bar{\theta} \cdot \bar{p}) \cdot \sum_{k=1}^{N-1=K} p_k \cdot \exp(\bar{\theta}_k)$$

$$\frac{\partial \Psi(\bar{y})}{\partial y_k} = \bar{\theta}_k = \log\left(\frac{p_k + \bar{y}_k}{p_k}\right)$$

where $\Psi(0)=0$. Hence $$\Psi(\bar{y}) = \sum_{k=1}^{K}\log\left(\frac{p_k + \bar{y}_k}{p_k}\right)(\bar{y}_k + p_k) - \log\left(\frac{\sum_{k=1}^{K}(p_k + \bar{y}_k)}{\sum_{k=1}^{K} p_k}\right) \quad (52.b)$$

$$C_{i,j}(\bar{y}) = \frac{\partial^2 \Psi(\bar{y})}{\partial y_i \partial y_j} = \left(\frac{1}{p_i + \bar{y}_i}\right) \cdot \delta_{i,j} \quad (52.c)$$

$$\det C(\bar{y}) = \prod_{k=1}^{K}\left(\frac{1}{p_k + \bar{y}_k}\right).$$

Corollary:

The p.d.f. of the deviation of the sample mean of the information from the entropy is given following (45) by, $$p(y, l) = \frac{d}{dy}\Pr\{X_l^w(\bar{u}) \le y\} \approx \left(\frac{1}{2\pi}\right)^{1/2} \cdot \sqrt{\psi''(y)} \cdot \exp\{-l \cdot \psi(y)\} \quad (53.a)$$

where:

$$\bar{f}_i = \log\frac{p(u_i)}{p(u_N)} \quad i=1 \ldots K = N-1 \quad (50)$$

which is equivalent to the solution of $$\psi(y) = y\psi'(y) - \log M(\psi'(y)) \quad (53.b)$$

$$\psi(y) = \sup_{\theta}\left(\theta \cdot (H + y) - \log\sum_{i=1}^{|U|} p(u_i)^{1-\theta}\right). \quad (53.c)$$

2.5. FINITE LENGTH BLOCKCODING FOR MEMORYLESS SOURCES

We now apply the theorems that we have developed for the general ergodic case to the problem of memoryless source coding. We will derive computational algorithms to express the key terms that we have defined for the general case, such as $\hat{R}(D,\iota)$ and $P_e(R,D,\iota)$. It was not possible to have expressions for the general cases, whereas in the i.i.d. it is possible.

In this work we would like to correct the inconsistency that exist in the classical work of Shannon. In Shannon's theorems and others later, the bounds were studied only on the rates needed by any block code for data compression such that the average per-letter distortion satisfies the condition in the sense of the expected value. He speaks of $\iota D$ as the average block distortion of the code, but not exactly as the maximum distortion of a codeword in the code. The two interpretations are equivalent only as the blocklength goes to infinity. Then the differences vanish asymptotically. We believe that the terms in theory should be unified such as the source-compression coding theorem which states that it is possible to select $S = \exp \iota R$ codewords of blocklength $\iota$ so that the probability of a sourceword of blocklength $\iota$ occurring that cannot be encoded within distortion at most $\iota D$ decays exponentially in the i.i.d. case. There is some difference between these theorems, since Shannon's theorems deal with the average block distortion whereas the random coding and our results deal with the maximum distortion.

The Guidelines. Our approach to the problem is described in the following steps;

a. Definitions and explanation of the stochastic approach.
b. How the deterministic problem changes to a stochastic one and calculating the error probability.
c. Performance analysis and procedures to calculate $\hat{R}(E, \iota)$ for i.i.d. (and Merkovian) sources.

2.5.1. DEFINITIONS AND THE STOCHASTIC APPROACH

Given is a source u with known probabilities, an acceptable average distortion D and a rate R. Then for each blocklength $\iota$, a partition algorithm induces the probabilities on the codewords and define entropy $H_\upsilon(\iota)$. Every $\iota$ and every partition define entropy on codewords. We omit the subscript $\iota$ for convenience. The encoding procedure defines the optimal code set, namely "the codebook", with minimal probability of error. That is, $$\Gamma_\iota(D, \delta, H_\upsilon) = \overline{\upsilon} | \Pr(\overline{\upsilon}) \geq \exp(-\iota(H_\upsilon + \delta)) \quad (54)$$

The value $\delta = \delta(\iota, R)$, is determined such that, $|\Gamma_\iota(D, \delta, H_\upsilon)| = S = \exp(\iota R)$. We describe the Error set as a function of the entropy $H_\upsilon$, $$\mathrm{Error}(\delta, D, H_v) = \left\{ \overline{u} \,\Big|\, \min_{\overline{v}: \rho(\overline{u}, \overline{v}) \leq D} -\frac{1}{l} \log Pr(\overline{v}) - H_v \geq \delta \right\}. \quad (55)$$

The encoder-decoder pair is a deterministic machine. This implies that the conditional entropy $H(\overline{\upsilon}|\overline{u})$ is zero. Thus, the entropy $H(\overline{\upsilon})$ of the codeword is equal to the mutual information $I(\overline{u}; \overline{\upsilon})$. Nevertheless, when restricting our attention to a single source output symbol without knowledge of the previous output symbols, then the reproducing symbol is not predetermined. At this level it is an output of a transition matrix and a memoryless source, even though at the block level the encoding is deterministic. We may describe the deterministic coding algorithm as stochastic one with the "best" transition matrix Q that simulates the data compression at the level of a single symbol. By considering the deterministic problem as a stochastic one, we use the theory of large deviations.

Hereandafter the index i denotes a letter in the source alphabet and j denotes the reproducing letters.

Definition 9:

We define the entropy of codewords $H_\upsilon$ of memoryless source, $$H_v(Q) = -\sum_j \sum_i p(i) q(j|i) \log \sum_i p(i) q(j|i)$$

Definition 10:

The expected value of the distortion between the sourcewords and codewords, denoted as $d_0$, is a function of the transition matrix Q, and its value is, $$d_0(Q) = \sum_j \sum_i p(i) q(j|i) d(i, j)$$

The vector $\overline{\tau}$ with N−1 components denotes the deviations of the empirical distribution of a sourceword, from the probability measure defined on the alphabet U. That is, $$\overline{x}_{k=i} = \left( \frac{N(i|\overline{u})}{l} - p(i) \right)$$

Definition 12:

The vector $\overline{y}$ NM−1 components denotes the deviations of the joint empirical distribution of one sourceword and a codeword, from the join probability measure defined on the Cartesian product U×V.

$$\overline{y}_{k=(i,j)} = \left( \frac{N(i, j | \overline{u}, \overline{v})}{l} - p(i, j) \right)$$

Definition 13:

The vector $\overline{d}$ is NM−1 components vector, where $$\overline{d}_{k=(i,j)} = (d(i,j) - d(N,M))$$

Without loss of generality we may assume the $d(N,M)=0$.

Definition 14:

The vector $\overline{t}$ is defined as $$\overline{t}_{k=(i,j)} = \log(p(j)/p(M)).$$

Without loss of generality we may assume that p(M) is the least probable symbol.

Recall the definitions of $\Psi(\overline{\tau}), C(\overline{\tau})$ in (52) and $\psi(y)$ in (53).

2.5.2. The Error Probability

In the performance analysis of optimal codes for data transmission it is necessary to find an estimate of the transmission error probability as a function of characteristic parameters of the code. In this section we deal with the analysis of the classical problem of D-semifaithful source coding known as data compression of a memoryless source. The problem was first introduced by Shannon [SH-48] as a particular case of the problem of transmission over a noisy channel. The exponential behavior of the error was derived by several authors, Arimoto [Ar-73], Marton [Ma-74] and Dueck Korner [DuKo-79], producing the result $$P_e \leq e^{-\iota F(R,D) + o(\iota)}, \quad (56)$$

where $\iota$ is the sourceword length, R the compression rate, and F(R,D) is a function of R,D. The methods of analysis techniques vary in their approach. However, these methods however fail to produce more than the controlling $O(\iota)$ exponential factor in the error behavior, as in (56).

One of the aims of this section is to give a method that by numerical procedures can obtain the full asymptotic expression of the error probability $P_e$ in the form $\log P_e = -\iota \cdot F(R, D, \iota)$. We find a procedure for finding $F(R,D,\iota)$. The expression seems to be new and may give a significant correction to the one term estimate in some ranges of the compression rate R, the distortion level D and sourceword length $\iota$.

Our method employs the full asymptotic expansion of the probability density function in the central limit theorem (CLT), as given in [KMST-85]. The parameters R and $\iota$, for some transition matrix Q, control the size of the code and therefore fix $\delta(R,\iota)$. With $\delta$ known we can estimate the probability of error using linear programming and large deviations theory for some Q. The decay rate is expected to be exponential since $Pr(\Gamma^e)$ is the tail of the distribution of the average of iid variables. The CLT asserts that the distribution of this average is asymptotically normal as $\iota \to \infty$. The known estimate for the error probability (56) is given in [B$\iota$-87] where F(R,D), the so called source-compression error exponent, is given by $$F(R, D) = \max_{a \geq 0} \min_{t \leq 0} \max_Q \left[ sR - stD - \log\left( \sum_{i=1}^{|U|} p_i \left( \sum_j \left( \sum_i p_i q_{j|i} \right) e^{td(i,j)} \right)^{-\delta} \right) \right]. \tag{57}$$

Inequality (56) seems to be the best estimate available in the literature. The purpose of this section is to give a more accurate estimate of the error than (56) and (57). We develop a method for obtaining an asymptotic expansion of $P_e$ for large $\iota$. The special case for the loseless source coding was studied by Covo [Co-92].

Theorem 7:

The minimal error probability given a distortion level D, by a block code of rate R and blocklength $\iota$ for an i.i.d source, satisfies the following equations, $$P_e(R, D, l) \approx \tag{58}$$

$$\min_Q \begin{cases} 1 & \text{if } (\bar{x} = 0) \in D. \\ \sqrt[D]{\left(\frac{1}{2\pi}\right)^K detC(\bar{x}^+)} \cdot \exp\{-l\Psi(\bar{x}^+)\} & \text{if } (\bar{x} = 0) \in D^c. \end{cases}$$

For some Q, the term $\delta$ is given by the equation, $$R \approx (H_v + \delta - \psi(\delta)) - \frac{\log l}{2l} + \frac{\log \sqrt{\frac{\psi^{ij}(\delta)}{(2\pi)}} \cdot \frac{1}{(1 - \psi^t(\delta))}}{l}. \tag{59}$$

Then, denote the minimum of $\Psi(\bar{\tau})$, for some Q, on the boundary of D which is obtained at $\bar{\tau}^*$, as $$\Psi(\bar{x}^*) = \inf_{\bar{x} \in \partial D} \Psi(\bar{x}) \tag{60}$$

and define the region for some Q, $$D = \bar{\tau} | \bar{y}^z(\bar{\tau}, D) \cdot \bar{\iota} > \delta \tag{61}$$

where $\bar{y}^z(\bar{\tau},D)\bar{\iota}$ is the solution of the following simplex problem, Minimize $\bar{y} \cdot \bar{\iota}$ subject to $\tag{62}$ $A \cdot \bar{y} = \bar{x} - p(u_i, v_j) \leq \bar{y} \cdot \bar{e}_{k=(i,j)} \leq 1 - p(u_i, v_j)$ $\forall k = 1 \ldots NM - 1$ $p(u_N, v_M) - 1 \leq \bar{y} \cdot \bar{1}_y \leq p(u_N, v_M)$ $\bar{y} \cdot \bar{d} \leq D - d_0$ where A represents the transform matrix between $\bar{y}$ to $\bar{x}$, $\bar{1}_y$ is a vector with 1 in all of its components and $\bar{e}_k$ is a unit vector. The terms $\psi$, $\Psi(52)$, (53), and $d_0, p(u,v), \bar{\iota}, H_v$, are known functions of Q.

The Merkovian source case has a similar solution.

Proof:

Step 1: The Error Event.

Define the random variable as in (28), $$X_l^w(\bar{v}) = -\frac{1}{l} \log Pr(\bar{v}) - H_v. \tag{63}$$

Following (54) we choose as the code set all the codewords that satisfy the condition on their probability $Pr(X_t^w(\upsilon) \leq \delta)$ for some transition matrix Q which simulate the partition that induce probabilities on the codewords.

Given the partition simulated by Q, we define the random variable $P(\bar{u})$ as the probability of the most probable codeword contained in the D-Ball around the sourceword $\bar{u}$.

$$P(\bar{u}) = \max_{\bar{v}: \rho(\bar{u},\bar{v}) \leq D} Pr(\bar{v}) \tag{64}$$

and from (4) and definition 6, the average of the per letter distortions for the letters that comprise the $\iota$ length blocks is, $$\rho_l(\bar{u}, \bar{v}) = \sum_j \sum_i \frac{N(u_i, v_j | \bar{u}, \bar{v})}{l} d(i, j). \tag{65}$$

Hence, (64) is transformed to, $$P(\bar{u}) = \max_{\bar{v}: \sum_j \sum_i \frac{N(u_i, v_j | \bar{u}, \bar{v})}{l} d(i,j) \leq D} \prod_{j=1}^M p(v_j) \sum_i N(u_i, v_j | \bar{u}, \bar{v}). \tag{66}$$

The error event is the event that a D-Ball around the sourceword $\bar{u}$ does not contain any word from the selected codebook defined in (54). Following (55) (64), recall the definition of the error event, $$\text{Error}(\delta, D) = \left\{ \bar{u} \mid -\frac{1}{l} \log P(\bar{u}) - H_v > \delta \right\}. \tag{67}$$

Next, we define the random variable $Z(\bar{u})$ from (64) and (67), $$Z(\bar{u}) = -\frac{1}{l} \log P(\bar{u}) - H_v \tag{68}$$

which is following (66), $$Z(\bar{u}) = \min \sum_{j=1}^{M} \sum_{i=1}^{N} \left( \frac{N(u_i, v_j | \bar{u}, \bar{v})}{l} - p(u_i, v_j) \right) \cdot \log p(v_j) \text{ subject to} \quad (69)$$

$$\forall i = 1 \ldots N-1 \quad \sum_{j=1}^{M} \left( \frac{N(u_i, v_j | \bar{u}, \bar{v})}{l} \right) = \left( \frac{N(u_i | \bar{u})}{l} \right)$$

$$\sum_{j=1}^{M} \sum_{i=1}^{N} \left( \frac{N(u_i, v_j | \bar{u}, \bar{v})}{l} \right) = 1$$

$$\forall i, j \quad 1 \geq \frac{N(u_i, v_j | \bar{u}, \bar{v})}{l} \geq 0$$

$$\sum_{j=1}^{M} \sum_{i=1}^{N} \left( \frac{N(u_i, v_j | \bar{u}, \bar{v})}{l} \right) d(i, j) \leq D$$

or $$Z(\bar{u}) = \min \sum_{j=1}^{M} \sum_{i=1}^{N} \left( \frac{N(u_i, v_j | \bar{u}, \bar{v})}{l} - p(u_i, v_j) \right) \cdot \log p(v_j) \text{ subject to}$$

$$\forall i =$$

$$1 \ldots N-1 \quad \sum_{j=1}^{M} \left( \frac{N(u_i, v_j | \bar{u}, \bar{v})}{l} \right) - p(u_i, v_j) = \left( \frac{N(u_i | \bar{u})}{l} \right) - p(u_i)$$

$$\sum_{j=1}^{M} \sum_{i=1}^{N} \left( \frac{N(u_i, v_j | \bar{u}, \bar{v})}{l} \right) - p(u_i, v_j) = 0$$

$$\forall i, j \quad 1 \geq \frac{N(u_i, v_j | \bar{u}, \bar{v})}{l} \geq 0$$

$$\sum_{j=1}^{M} \sum_{i=1}^{N} \left( \frac{N(u_i, v_j | \bar{u}, \bar{v})}{l} \right) - p(u_i, v_j) d(i, j) \leq D - d_0$$

Without loss of generality we may assume that p(M) is the least probable code symbol. We denote by the index N the source symbol with zero distance from the least probable code symbol M i.e. $d(N,M)=0$. Therefore all elements of $\bar{t}$ and all elements of $\bar{d}$ are non negative.

Thus using definitions 9–14 formula (69) changes to the form of a simplex problem, $$Z(\bar{x}) = \min \bar{y} \cdot \bar{t} \quad s.t. \quad (70)$$

$$A \cdot \bar{y} = \bar{x}$$

$$-p(u_i, v_j) \leq \bar{y} \cdot \bar{e}_{k=(i,j)} \leq 1 - p(u_i, v_j) \; \forall \; k = 1 \ldots NM - 1$$

$$p(u_N, v_M) - 1 \leq \bar{y} \cdot \bar{1}_y \leq p(u_N, v_M)$$

$$\bar{y} \cdot \bar{d} \leq D - d_0$$

where A represents the transform matrix between $\bar{y}$ to $\bar{\tau}$, $\bar{1}_y$ is a vector with 1 in all of its components, and $\bar{e}_k$ is a unit vector.

We denote the vertex point $\bar{y}^*(\bar{\tau},D)$ as the minimum feasible solution which minimizes $\bar{y} \cdot \bar{t}$ under the constraints. Thus, $$Z(\bar{\tau}) = \bar{y}^*(\bar{\tau},D) \cdot \bar{t} \quad (71)$$

Next, we identify the region of $\bar{\tau}$ that correspond to the error event in (66) and (67) and the definition of $\bar{\tau}$ in definition 11, $$D = \bar{\tau} | \bar{y}^m(\bar{\tau},D) \cdot \bar{t} > \delta \quad (72)$$

Notice that the deviations of the empirical distribution of the sourceword $\bar{u}$ denoted by $\bar{\tau}$ are defined as a random vector variable depending on $\bar{u}$. Thus, we can describe the error event with $\bar{\tau}$ instead of $\bar{u}$ as in (55). The probability of the error event is, following (67) (68) (71) and (72), $$Pr(Z(\bar{x}) > \delta) = \int_D p(\bar{x}, l) d\bar{x} \quad (73)$$

where $p(\bar{\tau},\iota)$ is the p.d.f. of the deviations of the empirical distribution of sourcewords from the probability measure, as given in (52). The minimum error probability is obtained by minimization over Q, $$P_e(\delta(R, l), D) = \min_Q \left( \int_D p(\bar{x}, l) d\bar{x} \right) \quad (74)$$

where the function $\delta(\iota,R)$ is determined by fixing the size of the codebook to $S=\iota R$.

The value of $P_e(R,D,\iota)$ (74) can be evaluated by the large deviations theory. Recall the results (41) to (53). The solution of the error probability is derived in regions where the integral (73) converges to its approximate solution.

In the region where the origin $\bar{\tau}=0$ is included in D (72), the integral (73) is almost equal to 1, while in all other regions of $(D,\delta)$ the integral (73) decays exponentially with $\iota$ to zero.

Suppose the zero point $\bar{\iota}=0$ is not an interior point of D (72). Then, the minimum of $\Psi(\bar{\tau})$ on the boundary of D is obtained at $\bar{\tau}^z$. That is, $$\Psi(\bar{x}^*) = \inf_{x \in BD} \Psi(\bar{x}). \quad (75)$$

Clearly, the point $\bar{\tau}^z$ is a function of $(R,D,\iota)$. Hence the minimal probability of error is derived from (62)–(65), and has the form $$P_e(R, D, l) \approx \quad (76)$$

$$\min_Q \begin{cases} 1 & \text{if } (\bar{x} = 0) \in D. \\ \sqrt{\left(\frac{1}{2\pi}\right)^K \det C(\bar{x}^*)} \cdot \exp\{-l\Psi(\bar{x}^*)\} & \text{if } (\bar{x} = 0) \in D^c. \end{cases}$$

where D will be found in Step 2.

Step 2: Finding the threshold value $\delta(R,\iota)$.

At this step we consider the construction of the Codebook, as defined in in (54). Thus, recall the large deviation variable in (63). The error event is equivalent to the occurrence of a codeword, after the optimal partition has induced the probabilities on the codewords, outside the the Codebook $\Gamma_\iota$. That event is equivalent also to a large deviation of $X_\iota^w(\upsilon)$ from its mean the entropy $H_\upsilon(\iota)$. In other words, once the partition simulated by Q has induced probabilities and entropy on the codewords, an error occurs upon the appearance of a codeword containing more than an average of $H_\upsilon+\delta$ nats per symbol. The $\delta$ nats of excess information allowed per symbol are related to the coding rate R. In this step we still have to find the functional relation between $\delta,\iota$ and R. We use for that goal the density function of the deviation of average information from entropy as found in (53) based on the asymptotic theory of large deviations due to [KMST-85].

As in [CoS-91], we slice the set $\Gamma_\iota(\delta)$ (54), into subsets each mutually distinct, each containing words $\bar{\upsilon}$ with almost equal probability. Let $T_m$ be such a subset, using definition (63):

$$T_m(y_m,y_{m+1})=\bar{\upsilon}|y_m<X_n^w(\bar{\upsilon})\leq y_{m+1}$$

where $-H_\upsilon=y_0\leq y_\iota \ldots \leq y_{m\alpha}=\delta$. Since all $\bar{\upsilon}\epsilon T_m$ have almost equal probability, we have that the number of words in each slice is nearly the slice probability divided by the probability of each member. That is, $$|T_m|=p(y_m,\iota)\cdot\Delta y_m\cdot\exp\iota(H_\upsilon+y_m)$$

The set $\Gamma_\iota(\delta)$ is the union of all the distinct subsets $T_m$. Hence, summing over the slices gives the size of Codebook.

$$|\Gamma(\delta)| = \sum_m |T_m| = \sum_m p(y_m, l) \cdot \exp l(H_v + y_m) \quad (77)$$

By the mean value theorem and as the partition—norm is decreasing to zero—the summation (77) tends to an integral. That is, $$|\Gamma(\delta)| = \int_{-H_v}^{\delta} \exp n(H_v + y) \cdot p(y, l) d y \quad (78)$$

where $p(y,\iota)$ is the p.d.f. of the deviation of the average information of the codewords $\bar{\upsilon}$ from their entropy and is given in (53).

On the other hand we have defined the cardinality of the code:

$$|\Gamma_\iota(\delta)|=\exp(\iota R). \quad (79)$$

Thus, by equating both expressions for $|\Gamma(\delta)|$, (78) and (79), we obtain, $$e^{lR} = \int_{-H_v}^{\delta} \sqrt{\frac{l\psi''(y)}{2\pi}} \cdot e^{(l(H_v+y-\psi(y)))} d y \quad (80)$$

Covo [Co-92] has shown that the exponent function $y-\psi(y)$ reaches its maximum on the relevant range at the boundary point $y=\delta$. Therefore we expand $y-\psi(y)$ in Taylor series around $\delta$ and change variables and use Laplace method to evaluate the integral (80). It is known that the value of the integral for large $\iota$ is affected only by the neighborhood of $\delta$. That is, $$\varepsilon^{lR} = \sqrt{\frac{\psi''(\delta)}{2\pi l}} \frac{1}{1-\psi'(\delta)} e^{(l(H_v+\delta-\psi(\delta)))}\left(1 + O\left(\frac{1}{l}\right)\right) \quad (81)$$

after neglecting terms of $O(1/\iota)$ in the exponent, and terms which decay exponentially, the connections between $R,\iota,\delta$ can be evaluated, using (53), and (81), as $$R \approx (H_v + \delta - \psi(\delta)) - \frac{\log l}{2l} + \frac{\log\sqrt{\frac{\psi''(\delta)}{(2\pi)}} \cdot \frac{1}{(1-\psi'(\delta))}}{l}. \quad (82)$$

We have omitted most of the technical development and its reasoning, since we believe it does not contribute to the understanding of the whole matter. All details are presented in [Co-92], where the loseless encoding is treated in details.

Actually, the loseless case is a special case of our problem where D=0. Most of the reasoning in Step 2 is identical, since we consider the compaction of the codewords after the partition has been performed and has already induced the probabilities and entropy on the codewords. However, the reader is referred to Covo work [Co-92].

Next, by solving the non linear equation (82) we obtain the threshold value $\delta$. Substitution $\delta$ in (72) (73) (74) and (75) and minimization over Q in (76) following (74) proves the theorem. □

Corollary:

The "error" event generated by an optimal block coder with fidelity criterion D, rate R and of block-length $\iota$ for an i.i.d source contains the average information which measures the average loss of information per symbol. That quantity is $F(R,D,\iota)$ and is described by the following equations, $$F(R, D, l) = \quad (83)$$
$$-\log\frac{P_e(R, D, l)}{l} \approx \max_Q \begin{cases} 0 & \text{if } (\bar{x}=0)\in D. \\ \inf_{\bar{x}\in\partial D}\Psi(\bar{x}) + O\left(\frac{\log l}{l}\right) & \text{if } (\bar{x}=0)\in D^c. \end{cases}$$

for the maximizing Q, the term $\delta$ is given by the equation, $$R \approx H_v + \delta - \psi(\delta) + O\left(\frac{\log l}{l}\right). \quad (84)$$

Then, we define the region.

$$D=\bar{\tau}|\bar{y}^*(\bar{\tau},D)\cdot\bar{\iota}>\delta \quad (85)$$

where $\bar{y}^*(\bar{\tau},D)\bar{\iota}$ is the solution of the simplex problem, Minimize $\bar{y}\cdot\bar{\iota}$ subject to  (86)

$A\cdot\bar{y} = \bar{x}$ $-p(u_i, v_i) \leq \bar{y}\cdot\bar{e}_{k=(i,j)} \leq 1 - p(u_i, v_j)\ \forall\ k = 1 \ldots NM - 1$ $p(u_N, v_M) - 1 \leq \bar{y}\cdot\bar{\iota}_y \leq p(u_N, v_M)$ $\bar{y}\cdot\bar{d} \leq D - d_0$ where A represents the transform matrix between $\bar{y}$ to $\bar{\tau}$, $\bar{1}_y$ is a vector with 1 in all of its components and $\bar{e}_k$ is a unit vector.

The "error" event contains information measured by $-\log P_e$, therefore $F(R,D,\iota)$ measures the (average) loss of information per symbol due to the coding procedure. We see that up to $$O\left(\frac{\log l}{l}\right)$$

we may assign another information related interpretation to $F(R,D,\iota)$. Moreover, we identify the two Cramer's functions $\Psi$ and $\psi$ as information measures. Consider the information related term of the problem, $\delta_\iota$ as the original parameter of the problem. That is, given codewords of length $\iota$ and $\delta$ extra nats of information, we will try to calculate the number of nats (bits) needed for D-faithful encoding a symbol from the sourcewords whose average information does not exceed $H_\upsilon(\iota)+\delta$ nats. It is obvious that $H_\upsilon+\delta$ nats would be enough, since any of the considered codewords has lower average information. Considering (81) we conclude that the number of nats needed (up to $O(\log l/l)$) is $H_v+\delta-\psi(\delta)$. That is, we gained $\psi(\delta)$ nats from the non-uniform distribution of codewords in $\Gamma$. Most of the mass is obviously concentrated around $H_v$ nats. Since $F(R,D,\iota)=\Psi_Q(\delta)+O(\log l/l))$, the function $\Psi(R,D,\iota)$ is the information "loss". Now we may conclude the above discussion by following "law". Gaining $\psi_Q(\delta,\iota)$ nats in the compression results in the loss of $F(R,D,\iota)\approx\Psi_Q(\delta,\iota)$ amount of information in the transmission. We obtain a "conservation law", where the amount of the lost information is equal to the gain in the compression, only in the loseless case, as pointed by Covo [Co-92]. However, it is a new interpretation for the two Cramer's functions in context of information theory.

Corollary:

The expression for $\delta(\iota,R)$ (59) (82) can be approximated as $$\delta(R, l) = \delta_0(R) + \frac{\log l}{l}\delta_1(R) + \frac{1}{l}\delta_2(R) \quad (87.a)$$

where each term is accepted by taking the relevant order of $\iota$ and equating to (59). by successive approximation we have, following [Co-92], that $$\delta_0(R) = R - H_v + \psi(\delta_0) \quad (87.b)$$

$$\delta_1(R) = \frac{1}{2(1 - \psi'(\delta_0))} \quad (87.c)$$

$$\delta_2(R) = \frac{1}{2(1 - \psi'(\delta_0))}\log 2\frac{\pi(1 - \psi'(\delta_0))}{\psi''(\delta_0)} \quad (87.d)$$

2.5.3. The Operational Rate Distortion Blocklength Function

The operational rate distortion blocklength function $\hat{R}(D, l)$ in the i.i.d. case, is the minimal rate with exponential decaying error probability $P_e(R,D,l)$, generated by a code of blocklength $l$ for an i.i.d. source. The error event is defined such that a sourceword cannot be encoded within block distortion at most $lD$.

Theorem 8

The operational rate distortion blocklength function $\hat{R}(D, l)$ is the solution of the following equation, $$\hat{R}(D, l) \approx \min_Q \left[(H_u + \delta - \psi(\delta)) - \frac{\log l}{2l} + \frac{\log\sqrt{\frac{\psi''(\delta)}{(2\pi)}\cdot\frac{1}{(1-\psi'(\delta))}}}{l}\right] \quad (88)$$

where the minimization is carried on the set of possible transition matrices Q. The term $\delta$ satisfies $$y^*(D)\cdot\bar{t}=\delta \quad (89)$$

which is the solution of the simplex problem.

Minimize $\bar{y}\cdot\bar{t}$ subject to (90)

$$A \cdot \bar{y} = 0$$

$$-p(u_i, v_j) \le \bar{y}\cdot\bar{e}_{k=(i,j)} \le 1 - p(u_i, v_j) \forall k = 1 \ldots NM - 1$$

$$p(u_N, v_M) - 1 \le \bar{y}\cdot\bar{1}_y \le p(u_N, v_M)$$

-continued $$\bar{y}\cdot\bar{d} \le D - d_0$$

where A represents the transform matrix between $\bar{y}$ to $\bar{x}$, $\bar{1}_y$ is a vector with 1 in all of its components and $\bar{e}_k$ is a unit vector. The terms $\bar{t}$, $H_v$, $\Psi$, $\psi$, $d_0$, $p(u_i, v_j)$ are functions of the transition matrix Q.

The Markovian source case has a similar solution.

Proof

The function $\hat{R}(D,l)$ is defined as the bound rate where the error probability starts decaying exponentially. In Laplace integral this happens when the zero point is on the boundary of D. Thus, we impose $\bar{x}=0$ on the boundary. That is, the solution of the simplex problem (90), denoted $\bar{y}^*(0,D)$, satisfies $$\bar{y}^*(\bar{x}=0,D)\cdot\bar{t}=\delta(R,l) \quad (91)$$

The minimization over Q is required to attain the bound. $\delta$ $\hat{R}(D,l)$ is the minimum number of D-Balls needed to cover a subset of all sourcewords while keeping an arbitrary small error probability that decays to zero with l. It is clear that as $l\to\infty$ we obtain that $\delta=(\Psi(\delta)=0$ and $\hat{R}(D)=R(D)=H_v$. That is, as known for the general case, the operational rate distortion function converges to the rate distortion function R(D) which is the minimal entropy subject to the fidelity constraint.

Definition 15

The function $D_{max}(l)$ denotes a distortion level for some blocklength l, such that for all $D > D_{max}(l)$ the decoder does not require any information from the source and decode such that the error probability tends to zero exponentially with l.

The meaning is that one D-Ball of radius $D_{max}(l)$ is sufficient to cover almost all of the sourcewords space while keeping an arbitrarily small error measure.

Theorem 9

The function $D_{max}(l)$ satisfies the condition, $$\min_Q \left[(H_u + \delta - \psi(\delta)) - \frac{\log l}{2l} + \frac{\log\sqrt{\frac{\psi''(\delta)}{(2\pi)}\cdot\frac{1}{(1-\psi'(\delta))}}}{l}\right] = 0 \quad (92)$$

where the minimization is carried on the set of possible transition matrices Q. The term $\delta$ satisfies $$\bar{y}^*(D_{max})\cdot\bar{t}=\delta \quad (93)$$

which is the solution of the simple problem,

Minimize $\bar{y}\cdot\bar{t}$ subject to (94)

$$A \cdot \bar{y} = 0$$

$$-p(u_i, v_j) \le \bar{y}\cdot\bar{e}_{k=(i,j)} \le 1 - p(u_i, v_j) \forall k = 1 \ldots NM - 1$$

$$p(u_N, v_M) - 1 \le \bar{y}\cdot\bar{1}_y \le p(u_N, v_M)$$

$$\bar{y}\cdot\bar{d} \le D_{max} - d_0$$

where A represents the transform matrix between $\bar{y}$ to $\bar{x}$, $\bar{1}_y$ is a vector with 1 in all of its components and $\acute{e}_k$ is a unit vector. The terms $\bar{t}$, $H_v$, $\Psi$, $\psi$, $d_0$, $p(u_i, v_j)$ are functions of the transition matrix Q.

Proof

This is the case $\hat{R}(D_{max}, 1)=0$.
It is known [Bl-87] that, $$D_{\max} = \lim_{l \to \infty} D_{\max}(l) = \min_j \sum_i p(i)d(i, j). \quad (95)$$

It comes out from (92)–(94) as l tends to infinity, since $D_{max}=d_0(Q)$ and $H_v(Q)=0$. Hence, all source letters are transformed at the decoder to one letter which is the reproducing letter $v_j$ that achieves the minimum expected distortion as in (95).

In the results of this section we have merged and proved a few of the main theorems of information theory—the source compression coding theorem due to Shannon, Berger, Gray and others, the information content of sources under distortion due to Ziv and the random coding bound and the error exponent due to Jelinek, Marton and Blahut. Our results agree with Ornstein Shields results for the more general ergodic case. We extended their results for memoryless sources and obtain a full asymptoitc expansion of the error probability $P_c$ and the rate distortion blocklength function $\hat{R}$ for large blocklength l, in contrast with the traditional approach which yields only upper bounds for $P_c$ and $\hat{R}$. The results for $D_{max}(l)$ is new for a finite blocklength. It is known only as $l \to \infty$.

2.6. Summary

We believe that the methods and results presented in this chapter give a new and comprehensive insight to the problem of block coding data compression. We begin with the general ergodic case and obtain new results concerning its convergence, the error probability and constructive methods, though not very useful, for solving for block coding problem.

We have proved that the preceding algorithms almost surely the bound R(D). The problem is in the implementation of such algorithms. It is extremely complex. But, the algorithms and the proofs related to them are highly important for the proof of the optimality of our new universal source coding methods as will be described in the coming chapters.

To summarize, blockcoding for finite length l has its theoretical merits, but it is not practical. In general, all the algorithms are NP problems in the sense that they require scanning of an exponentially large class of codes, to find one which performs best for this block. Moreover, the assumption of knowing the source statistics is not practical and therefore all these methods are practically useless.

It is known [OS-90] that the rate distortion function R(D) is also the best one can do asymptotically on the average with variable-length codes on the entire space. We can prove it as well by modifying our proof in Theorem 1 from a fixed l to a variable length. However, we shall see later in this dissertation, that this is not the case for multi rates systems.

Next, we consider the special case of i.i.d. source and study the exact connections between blocklength l, rate R, the distortion level D and the performance quantities such as the full expansion of the error probability, the operational rate distortion blocklength function and $D_{max}$, all for a specific finite blocklength. Since Shannon work in 1948, the problem was studied by many researchers. Berger, Blahut, Gray, Ziv, Kieffer, Arimoto, Marton, Dueck, Korner and many others. Almost all of them treated the limit case as $l \to \infty$ and usually they related to only one aspect of the problem, either the rate distortion function or the error probability. This is the first, as we believe, consistent and harmonic study of the issue where all the terms, quantities and parameters of the problem conform to create one description of the problem. In this section we have merged and proved a few of the main theorems of information theory for memoryless sources—the source compression coding theorem due to Shannon, Berger, Gray and others, the information content of sources under distortion due to Ziv and the random coding bound and the error exponent due to Jelinek, Marton and Blahut.

Universal Data Compression by Approximate String Matching

We propose two practical universal source coding schemes based on approximate string matching. One is an approximate random-length string matching data compression, and the other is LZ-type quasi parsing method by approximate string matching. It is shown in this chapter, that in the former algorithm the compression rate converges to the theoretical bound of R(D) for ergodic and stationary processes as the average string length tends to infinity given an appropriate database. A similar result holds for the latter algorithm in the limit of infinite database size. We evaluate the performance of the two algorithms in practical cases where data base size is finite and where the string length is finite. In addition we prove some asymptotic properties concerning the workings of an approximate string matching algorithms for ergodic stationary sources.

3.1. Universal Source Coding

In this chapter our challenge is one of the most important problems of information theory. Actually, this is the basic Shannon problem, though he could only prove an existence of optimal coder but not to construct such a coder. The challenge is to compress data without any prior knowledge, neither deterministic not statistic knowledge, subject to a fidelity criterion, such that we attain the bound R(D) for a general ergodic and stationary source. Moreover, we require that the algorithms will be optimal for all distortion measures, not only for Hamming distance or MSE (mean square error). Also, we require a realizable implementation by a Turing machine.

Approximate string matching is a technique with considerable theoretical merits and practical promise. Our major motivation comes from data compression theory, although we believe that our results might have wide range of applications in patterns recognition theory, artificial intelligence, biological research and in particular the Genome Project, and theorems for continuous sources.

Universal source coding algorithms that achieve the theoretical bound, R(D), are still unknown. Such Algorithms may be useful in image and voice compression, medical applications and DNA sequences compression.

An example of a possible application is "visual telephony" (known also as videophone). A voice signal can be transported through a telephone network with a bandwidth of 3.4 KHz while a video signal, using a regular television signal requires a bandwidth of 4.3 MHz, a ratio of 1:1265 [Li-90]. Even though a picture is worth a thousands words, almost no one would want to pay for a visual conversation costing a thousand times more than a telephone call, assuming that connections are tariffed on the basis of bandwidth usage. Consequently, bandwidth reduction is the necessary first step to bringing visual telephony closer toward reality.

A lot of work has been done in the last two decades in the field. It is clear that the compression technique has to be standardized, otherwise there is no communication. The next step is to attain significant cost reduction by employing VLSI technology. The last step is the availability of a transport network to provide the service.

The crucial point is to choose a compression method which is universal for all image sources and realizable. We believe the following algorithms as will be described in this chapter are the best fitting for such application. However, MPEG [LeG-91] has chosen a different technology based on DCT (Discrete Cosine Transform) to compress the data rate and a cascaded two-dimensional variable length coding scheme. We think that our algorithms are superior to this strange combination of old technologies, which has no theoretical proof of optimality. Our guess is that a fair competition between our algorithms and MPEG will result in our victory. That is, because almost surely there is an approximate string matching between a two-dimensional block in the current frame and a block in the previous frames in a spatial neighborhood.

The history of practical universal source coding begins with the important papers of Lempel and Ziv who proposed two algorithms [LZ-77] [LZ-78] for compression of individual sequences by an information-lossless encoder. Their algorithms are based on a parsing procedure which creates a new phrase as soon as a prefix of the still unparsed part of the string differs from all preceding phrases. Many modifications in universal source coding have been introduced. However, this does not seem to be the case for lossy algorithms.

Berger [Be-71], Blahut [Bl-72], [Bl-74], [Bl-76], [Bl-87], Ziv [Z-72], Omura [Om-73], Marton [Ma-74], Gray [Gr-75], Neuhoff [Na-75], Mackenthun and Pursley [MaPu-78], Kieffer [Ki-78], Ornstein and Shields [OS-90], and others proved the existence of universal codes subject to a fidelity criterion. These works vary in the assumptions on the class or sources, the fidelity criterion and the type of convergence of the rates to the rate distortion function. In most cases, the construction of a code involves the following step: given a block of source symbols, find that code in an exponentially large class of codes, which performs best for this block. This task is prohibitively complex even for modest codebook sizes and makes these schemes impractical for implementation. More than that, most of the schemes postulate that the a-priori distribution of the source of some statistical information are known. Such postulates are inappropriate in a design of a universal machine.

We propose two practical universal source coding schemes based on approximate string matching. One is an approximate random length string matching data compression, and the other is LZ-type quasi parsing method by approximate string matching. It is shown that in the former algorithm the compression rate converges to the theoretical bound, R(D), as the database size and the string length tend to infinity. A similar result holds for the latter algorithm in the limit of infinite database size. The algorithm of Lempel Ziv is obtained as a special case of no distortion for the quasi parsing method by approximate string matching.

We study and present the performance of the two algorithms in practical cases where the data base size is finite and where the range of string length is finite. In addition, we prove the duality between the two algorithms. We will obtain theorems which extend the Kac Lemma to the approximate string matching methods and theorems concerning the rate distortion function of a stationary ergodic information source. We use these results to yield some insight into the workings of our data compression coding schemes. In addition, we prove some asymptotic properties concerning the workings of an approximate string matching algorithms on ergodic stationary sources. We adopt the terminology and some of the reasoning of Wyner-Ziv [WZ-89], and Ornstein-Weiss [OW-93] in their work concerning lossless algorithms. We base our proofs, mainly, on Wyner-Ziv [WZ-89] and Ornstein-Shields [OS-90]. Our proofs and algorithms also apply, virtually without change in proof, to random fields.

The chapter is organized as follows. Section 3.2 is dedicated to the extension of Kac's Lemma [Ka-47]. Section 3.3 deals with the description and proof of convergence in probability of the algorithms. Section 3.4 is dedicated to the presentation of practical cases where the string length is finite or database size is finite or both. The rate of convergence is addressed. In section 3.5 we raise some practical issues and give a short summary.

3.2. The Principal Lemma of Approximate String Matching

Let v be a finite valued stationary infinite sequence. Let $v_i^j$ denotes a sample sequence or a block. Here, by a block we mean a block of consecutive symbols in the sequence. The notation $v_i^j$ stands for a block between positions i,j in the sequence v.

We present the basis idea in approximate string matching, which is an extension of Kac's Lemma [Ka-47]. The proof uses similar reasoning to that of the Kac Lemma due to L. H. Ozarow and A. D. Wyner.

Let B be a set of strings of length l, i.e. $B \subseteq V^l$ and Pr(B)>0. The notation $Y_n$ stands for $Y_n = v_n^{n+l-1}$, and we say that that two strings $Y_n$, $Y_m$ are approximately matched with respect to B if $Y_n \in B$, $Y_m \in B$. We define the conditional probability that an approximate match with respect to B occurs at the first time at step k, $$Q_k(B) = Pr\{Y_k \in B; Y_j \notin B; 1 \leq j \leq k-1 | Y_0 \in B\}. \quad (1)$$

Let $\mu(B)$ denote the average recurrence time with respect to B given that $Y_0 \in B$. That is, $$\mu(B) = \sum_{k=1}^{\infty} k Q_k(B). \quad (2)$$

Define the event $$A = \{Y_n \in B; Y_j \in B \text{ for some } n, -\infty \leq n \leq \infty\}.$$

The Extended Kac Lemma

We claim that for stationary process,

$$Pr\{A\} = PR\{Y_0 \in B\} \mu(B).$$

In particular, for stationary ergodic sources we have, $$1 = Pr\{Y_0 \in B\} \mu(B) = Pr\{B\} \mu(B). \quad (3)$$

Proof: We slice the event A, $$A_+ = \{Y_n \in B \text{ for some } n, 0 \leq n \leq \infty\}$$

$$A_- = \{Y_n \in B \text{ for some } n, -\infty \leq n \leq -1\}.$$

Then $$A = A_- \cup A_+ = A_+ A_- + A_+ A_-^c + A_+^c A_-.$$

where + denotes disjoint union. We first show that $$Pr\{A_+ A_-^c\} = Pr\{A_+^c A_-\} = 0.$$

Intuitively, it is clear that in any infinite length time slot the event must occur. However, for the formalists, if the event $A_+$ occurs, then there is a smallest $j \geq 0$, such that $Y_j \in B$. Thus, $$Pr(A_+ A_-^c) = \sum_{j=0}^{\infty} Pr\{Y_n \notin B, -\infty \leq n < j; Y_j \in B\}$$

But since the $\{Y_n\}$ are stationary, the summand does not depend on j and must be therefore 0. Therefore, with the same reasoning we have, $Pr\{A_+ A_-^c\} = Pr\{A_+^c A_-\} = 0$.

Now, if the two events $A_+$ and $A_-$ occur, there must be a smallest $j \geq 0$, such that $Y_j \in B$, and a smallest $k > 0$, such that $Y_{-k} \in B$. Thus, $Pr(A) =$ $$Pr(A_+ A_-) = \sum_{k=1}^{\infty} \sum_{j=0}^{\infty} Pr\{Y_n \notin B, -k+1 \leq n < j; Y_{-k} \in B; Y_j \in B\} =$$

$$\sum_{k=1}^{\infty} \sum_{j=0}^{\infty} Pr\{Y_{-k} \in B\} Pr\{Y_n \notin B, -k+1 \leq n < j; Y_j \in B \mid Y_{-k} \in B\} =$$

$$\sum_{k=1}^{\infty} \sum_{j=0}^{\infty} Pr\{Y_0 \in B\} Q_{j+k}(B),$$

where the last step follows from the stationarity of $Y_n$. Now for $k \geq 1$, $Q_i(B)$ appears in the last summation exactly i times—i.e. for (j,k) in (0,i), (1,i-1) ... (i-1,1). Thus, $$Pr(A) = Pr\{Y_0 \in B\} \sum_{i=0}^{\infty} i Q_i(B) = Pr\{Y_0 \in B\} \mu(B).$$

In particular, for stationary ergodic sources we have, $$1 = Pr\{Y_0 \in B\} \mu(B) = Pr\{B\} \mu(B).$$

3.3. Algorithms and Convergence to R(D)

3.3.1. Definitions

Let u be an ergodic finite valued stationary sequence with an entropy H. Let $\bar{u}$ denote a sample sequence or a block. The notation $u_i^j$ stands for a block between positions i,j in the sequence u. The sequence $u_{-n}^{-1}$ is our data base.

Definition 1

We look at the positive time at the sequence $u_0, u_1 \ldots$ Let L be the first index such that the string $u_0 \ldots u_{L-1}$ is not a substring of the data-base $u_{-n}^{-1}$. That L is equal to $L_n(u)$. That is, for $n = 1, 2 \ldots$ let $L_n(\bar{u})$ be the smallest integer $L > 0$ such that, $$u_0^{L-1} \neq u_{-m}^{-m+L-1} \quad L \leq m \leq n$$

$$L_n(u) = \inf(L > 0: u_0^{L-1} \neq u_{-m}^{-m+L-1}, L \leq m \leq n).$$

Definition 2

The random variable $N_1(\bar{u})$ for $l > 0$ is the smallest integer $N \geq 1$ such that $$j_0^{l-1} = u_{-N}^{l-1-N}$$

$$N_1(\bar{u}) = \inf(N \geq l: u_0^{l-1} = u_{-N}^{l-1-N}).$$

Wyner-Ziv [WZ-89] proved for a stationary ergodic source that for each l-block sample sequence $\bar{u}$ and every $\in > 0$, $$\lim_{l \to \infty} Pr\left(\left|\frac{\log N_l(\bar{u})}{l} - H\right| \geq \epsilon\right) = 0.$$

Orstein-Weiss [OW-93] proved that $$Pr\left(\lim_{l \to \infty} \frac{\log N_l(\bar{u})}{l} = H\right) = 1.$$

Given alphabets U and V, a distortion measure is any function $d: |U \times V| \to (0 \ldots \infty)$. the function d measures the distortion (cost, penalty, loss etc.) suffered each time the source produces letters $u \in V$. Usually, the range of d is finite and without loss of generality we may assume that for all k, $\min_j d(u_k, v_j) = 0$.

Let $\rho(\bar{u}; \bar{v})$ denote the distortion for a block—the average of the per letter distortions for the letters that comprise the block, $$\rho(\bar{u}, \bar{v}) = \frac{1}{l} \sum_{k=1}^{l} d(\bar{u}_k; \bar{v}_k). \tag{4}$$

The pair $(\bar{u}_k; \bar{v}_k)$ denotes the letters at the i-position at the source and the user respectively. The distortion is assumed to the memoryless.

Definition 3

For each sample sequence $\bar{u}$ of length l, taken from the sequence $\mu$, we define a set D-Ball, $$D\text{-Ball}(\bar{u}) = \{\bar{v} | \rho(\bar{u}, \bar{v}) \leq D\}.$$

Hereinafter the definitions of the sequences u and v are slightly changed. Again, let u be an ergodic stationary source sequence defined on an alphabet U. We do not require finite entropy for u. Let v be a finite valued ergodic stationary sequence defined on an alphabet V.

We generalize definitions 1, 2 for the lossy case by using the sequence $v_{-n}^{-1}$ as our data base.

Definition 4

For each sample sequence $\bar{u}$ we define the random variable $$DL_n(\bar{u}, v_{-n}^{-1}) = \max_{\bar{v}: p(\bar{u}, \bar{v}) \leq D} L_n(\bar{v}, v_{-n}^{-1})$$

That is, using the sequence $v_{-n}^{-1}$ as our data base, we continue the sequence $u_0, u_1, \ldots$ until there is no L string $\bar{v}$ in the D-Ball surrounding the L string $\bar{u} = u_0 \ldots v_{L-1}$ such that $\bar{v}$ is a substring of the data-base $v_{-n}^{-l}$. We define $DL_n(\bar{u}, v_{-n}^{-1}) = L$.

Definition 5

For each sample sequence $\bar{u}$ we define the random variable $$DN_l(\bar{u}, v_{-k}^{-1}) = \min_{\bar{v}: p(\bar{u}, \bar{v}) \leq D} N_l(\bar{v}, v_{-k}^{-1})$$

That is, we choose all the l-length strings taken from $V^l$ that are neighbors of $u_0^{l-1} = \bar{u}$. From this ensemble we select the string $\bar{v}$ with the smallest $N_l(\bar{v})$. the selected $\bar{v}$ is the element in D-Ball($\bar{u}$) with the minimal first repetition.

3.3.2. Duality

We present a duality between the two random variables of definitions 4,5. Later we will prove that this duality implies duality between the proposed algorithms.

Duality Lemma

For each sample sequence $\bar{u}$, a database $v_{-k}^{-1}$, and for any positive integers $n \leq k$ and $1 \leq n$, $$\{DN_l(\bar{u}, v_{-k}^{-1}) > n\} = \{DL_n(\bar{u}, v_{-n}^{-1}) \leq l\}. \tag{5}$$

Proof

For given positive integers $n, l$, $$\{DN_l(\bar{u}, v_{-k}^{-1}) > n\} =$$

$$\left\{ \min_{\bar{v}: \rho(\bar{u}, \bar{v}) \leq D} N_l(\bar{v}, v_{-k}^{-1}) > n \right\} = \{\forall \bar{v} \rho(\bar{u}, \bar{v}) \leq D, N_l(\bar{v}) > n\}.$$

As in Wyner Ziv [WZ-89], for positive integers $n, l$, $$\{N_l(\bar{v}, v_{-k}^{-1}) > n\} = \{v_0^{l-1} \neq v_{-m}^{l-1-m}, l \leq m \leq n\} = \{L_n(\bar{v}, v_{-n}^{-1}) \leq l\}$$

Thus, $$\{DN_l(\bar{u}, v_{-k}^{-1}) > n\} = \{\forall \bar{v} \rho(\bar{u}, \bar{v}) \leq D, L_n(\bar{v}) \leq l\} =$$

$$\left\{ \max_{\bar{v}: \rho(\bar{u}, \bar{v}) \leq D} L_n(\bar{v}) \leq l \right\} = \{DL_n(\bar{u}, v_{-n}^{-1}) \leq l\}. \quad \square$$

3.3.3. Approximate Random-Length String Matching Data Compression

Let Len be a fixed integer. The blocklength $l$ is selected randomly from $1 \ldots$ Len. The sequence $u_0, u_1 \ldots u_{l-1}$ is the new block. We look at the positive time at $u_0, u_1 \ldots u_{l-1}$. The new sequence can be compressed by assigning indices to blocks since we have assigned an index to each symbol in the database.

The data compression scheme is as follows. Assume the encoder and the decoder have the same database, $v_{-n} \ldots v_{-1}$, defined on $V$.

Data Compression Scheme A

1. Choose a number $l$ from an independent generator of random integers uniformly distributed with pmf $q(l) = 1/\text{Len}$, $l = 1, 2, \ldots$ Len. Transmit the chose integer $l$.
2. Choose a string $\bar{u} = u_0^{l-1}$ of length $l$.
3. If $u_0^{l-1}$ can be approximately matched up to tolerance $D$ by a substring of $v_{-n}^{-1}$, encode it by specifying $DN_1(\bar{u}, v_{-n}^{-1})$. Append string $v_{-DNl}^{l-1-DNl}$ to database at position $0$.
4. If not, append to the database the string $v_0^{l-1}$, which is the best block code of the current $u_0^{l-1}$ string based on the accumulated empirical distribution in the past of $u$. Block-coding algorithms are discussed above.
5. Add a bit as a flag to indicate if there is a match or not.
6. Repeat the process from step 1, with a new string of randomly chosen length and a database $v_{-n+1}^{l-1}$. Shift the indices by $l$ to the appropriate values.

The scheme has two modes of operation. If there is an approximate matching the database is augmented by a string and concatenated. Otherwise, during the mode of "boot-strap" the machine appends an optimal blockcoded codeword basing on the empirical distribution of $u$. Optimal blockcoding algorithms are discussed above. One of them can be adopted. After sufficient time the probability of no approximate matching. (No-Match event) decays to zero. After the database is sufficiently large, we have a Turing machine with infinite memory, such that it works only in mode of approximate string matching.

At this stage we have to explain why we have randomized the blocklength. Wyner and Ziv [WZ-89] have taken fixed blocklength for their version. However, in this case a fixed blocklength will not produce a stationary process.

We consider the situation after sufficient time has elapsed. Due to ergodicity all strings with positive measure have occurred. The probability of "No Match" is zero and almost surely all l-strings of v are generated by assignment from the process itself. We consider an assignment from index position $j$. That is, $j$ is the initial position of a new block assignment. The new assignment is described by the following transition probability.

$$Pr\{v_j^{j+l-1} = \bar{v} \mid u_j^{j+l-1} = \bar{u}\} = Pr\{v_{j-N}^{j-N+l-1} = \bar{u}\rho(v_{j-1}^{j-1}, u_j^{j+l-1}) > D \ldots,$$

$$\rho(v_{j-N+1}^{j-N+l}, u_j^{j+l-1}) > D, \rho(v_{j-N}^{j-N+l-1}, u_j^{j+l-1}) \leq D\}$$

for any $l$ and $\bar{v} \in V^l$. If $l$ were a fixed constant, then for any positive integers $k, n$ for $\bar{v} \in V^n$, we would have to determine what is the dependence of the initial position on $l$, that is the shift $k$ mod $l$. The crux of the matter is the dependence on $l$. We have for any $k, n$ $$Pr\{v_k^{k+n-1} = \bar{v}\} = Pr\{v_{k+l}^{k+l+n-1} = \bar{v}\} = Pr\{v_{k \bmod l}^{k \bmod l+n-1} = \bar{v}\}.$$

That is, for a fixed blocklength $l$ we would have $l$–stationary process. But, by randomizing the blocklength we obtain the required property of stationarity.

Stationarity Lemma

Given a stationary process $u$, after sufficient time the output of the encoder-decoder pair described in scheme A, with a fidelity criterion of distortion $D$, namely the process $v$ is stationary.

Proof

Due to ergodicity all strings with positive measure have occurred. The probability of "No Match" is zero and almost surely all l-strings are generated by assignment from the process itself. We consider an assignment from index position $j$. That is, $j$ is the initial position of a new block assignment. We consider all sourcewords $i$ a ball of radius D around $\bar{v}$ as D-Ball($\bar{v}$). Thus the probability is, $$Pr\{v_j^{j+l-1} = \bar{v}\} =$$

$$\sum_{\bar{u} \in D-Ball(\bar{v})} Pr(\bar{u}) Pr\{v_{j-N}^{j-N+l-1} = \bar{v}\rho(v_{j-1}^{j-1}, u_j^{j+l-1}) > D \ldots,$$

$$\rho(v_{j-N+l}^{j-N+l}, u_j^{j+l-1}) > D, \rho(v_{j-N}^{j-N+l-1}, u_j^{j+l-1}) \leq D\}$$

for any uniformly distributed random variable $l$ and $\bar{v} \in V^l$. Consider any positive $k, n$ for $\bar{v} \in V^n$. If we consider n block that does not start where an assignment has been started, we would obtain prefix in the first assignment and a suffix in the last assignment. The lengths of the prefix and suffix affect the behavior of a general n block. The crux of the problem is to prove the independence of the measured of the block on $k$. We have to prove that for any $k, n$ $Pr\{v_k^{k+n-1} = \bar{v}\}$ is independent of $k$. The case is presented in the following figure.

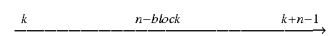

-continued

Random Length Assignment

We choose a block of length n from position k. However, since l is a random variable defined on 1 ... Len and uniformly distributed with pmf $q(l)=1/\text{Len}$, it is clear that the statistics of the number of assignments included in the block depends only on n and the statistics of l, but definitely not on k. Also, the knowledge of k does not provide any information for the determination of the prefix length and the suffix length in the block relative to the first and the last assignment of lengths, say, $L_0$ and $l_f$. Once k and n are given, the prefix length and the suffix length are random variable defined on points in the interval [0 ... Len−1] and are uniformly distributed with pmf $q(\text{prefix})=q(\text{suffix})=1/\text{Len}$. Thus, the expression $\text{Pt}\{v_k^{k+n-1}=\bar{v}\}$ is independent of the initial position k for all n and stationarity is proved.

In the following limit theorems we assume that the database size is infinite.

Limit Theorem A

Given is a D-semifaithful database $v_{-n}^{-1}$ generated by an optimal block-coder. The database size n is exponential with Len. At time zero we switch to encoder-decoder pair as described in Scheme A. Assuming Len tends to ∞, then for l-length sample sequence $\bar{u}$ taken from a stationary ergodic process u, in probability $$\lim_{l\to\infty}\left\{\frac{\log DN_l(\bar{u},v_{-\infty}^{-1})}{l}\middle|\; length=l\right\}=R(D). \tag{6}$$

Proof

After infinite time the database is an ergodic and stationary process as the input u is. All rare strings that have some positive probability have already occurred and the probability of NO-MATCH is zero.

Step 1

First we apply a deterministic partition of the sourcewords space. Such partition, or a similar, as described above, induces probabilities and entropy on the process v, such that the partition to the Codebook set on the codewords creates the best blockcoding.

The reader should be aware that the partition algorithm being described here is assumed fixed l and for a source with known probability structure. The probabilities are obtained according to the empirical distribution of u in its past from −∞ to zero time. The details are included above, where it was provided that such a partition attains the minimum entropy R(D) as blocklength tends to infinity.

The Partition Algorithm

We define spheres around all the possible codewords $\bar{v}$, $$Y(\bar{v})=\{\bar{u}|\rho(\bar{u},\bar{v})\leq D\} \tag{7}$$

The coding is a deterministic process which maps each sourcewords to exactly one codeword. We construct an algorithm that defines this mapping.

Denote the set of the sourcewords that map to the codeword $\bar{v}$ as $A(\bar{v})$. Clearly $A(\bar{v})\subseteq Y(\bar{v})$. In each step we create the the most probable subset which is mutually exclusive with all the sets already selected. Here $\bar{v}^j$ denotes the j-th codeword in the list.

Initialize
1. Define $Y(\bar{v})$ for all the possible codewords.
2. m=1.
3. $A(\bar{v})=Y(\bar{v})$, $\forall \bar{v}$.

Loop
4. Find the index k, k>m which satisfies $$Pr(A(\bar{v}^k))=\max Pr(A(\bar{v}^j)),\; j\geq m$$

5. Swap $\bar{v}^m$, $\bar{v}^k$.
6. Update all the remaining subsets $$A(\bar{v}^j)=A(\bar{v}^j)-A(\bar{v}^j)\cap A(\bar{v}^m),\; \forall j>m$$

7. m=m+1.
8. If $m\leq |V|^l$ then goto Loop else stop.

After the algorithm has been executed all the codewords are sorted such that to each codeword we assign the set of sourcewords mapped to it. The probability of each codeword is defined to be the probability of the set of sourcewords assigned to it.

$$Pr(\bar{v}^m)=Pr(A(\bar{v}^m)) \tag{8}$$

Then, the subsets $A(\bar{u}^m)$ form a full partition of the set of all sourcewords. The following properties are valid.

$$A(\bar{v}^j)\cap A(\bar{v}^m)=\emptyset\; \forall j\neq m$$

$$Pr(A(\bar{v}^j))\geq Pr(\bar{v}^m),\; \forall j<m$$

$$Pr(\bar{v}^j)\geq Pr(\bar{v}^m),\; \forall j<m$$

For any stationary ergodic source with known probabilities, the partition algorithm and the encoding procedure create the optimal code set, namely "the codebook", with minimal probability of error over the set of all acceptable partitions (Scheme A above).

$$\Gamma_l(D,\delta)=\{\bar{v}|Pr(\bar{v})\geq \exp(-l(R(D)+\delta))\} \tag{9}$$

The set $\Gamma_l(D,\delta)$ is the set of all codewords with probability exceeds the given threshold $e^{-l(R(D)+\delta)}$. The value $\delta=\delta(l,R)$, is determined such that, $|\Gamma_l(D,\delta)|=S=\exp(lR)$.

The error set is, $$Error(\delta,D)=\left\{\bar{u}\middle|\min_{-:\rho(\bar{v},\bar{v})\leq D}-\frac{1}{l}\log Pr(\bar{v})-R(D)>\delta\right\} \tag{10}$$

where the variable $\delta$ is determined above.

As discussed above the partition algorithm is a greedy algorithm that in each step makes the best possible decision to minimize the probability of the error set. The partition algorithm creates the probabilities that are assigned to each possible codeword. The encoding procedure has just to select the most probable codewords for the codebook. The size of the codebook is S. Thus, we define a certain threshold probability $p_l$ such that all S codewords have higher probability and the size of the set is S.

$$\Gamma_l=\{\bar{v}|Pr(\bar{v})\geq Pt\} \tag{11}$$

and the cardinality of the set is $|\Gamma_l|=S=\exp(lR)$. We define $\delta$ such that $\delta=-\log p_l/l-R(D)$. Thus, $\delta$ defines the code to consist all codewords such that, $$\Gamma_l(D,\delta) = \{\bar{v} | Pr(\bar{v}) \geq exp(-l(R(D)+\delta))\}. \quad (12)$$

The value $\delta = \delta(l,R)$, is determined such that, $|\Gamma_l(D,\delta)| = S = exp(lR)$. By definition the error event is described by, $$Error(D, \delta) = \left\{ \bigcup_{m=1 \ldots S} A(\bar{v}^m) \right\}^c$$

Equivalently, we may say that the error event is the event that a D-Ball around a sourceword $\bar{u}$ does not contain any word from the selected codebook.

$$Error(\delta, D) = \left\{ \bar{u} \left| \max_{-:\rho(\bar{v},\bar{v}) \leq D \atop \bar{u}} Pr(\bar{v}) < p_t \right. \right\} \quad (13)$$

Using the definition of $p_t$, $$Error(\delta, D) = \left\{ \bar{u} \left| \min_{-:\rho(\bar{u},\bar{v}) \leq D \atop \bar{v}} -\frac{1}{l}logPr(\bar{v}) - R(D) > \delta \right. \right\} \quad (14)$$

The reader is referred to the proof brought above, that the algorithm creates almost surely the optimal code. We could use another algorithm "Scheme B" to attain the same result. However, the error probability, denoted as $P_e(l,\delta, D) = Pr\{Error\}$, decays to zero with l.

Step 2

Conversely, we apply the partition algorithm and construct a Codebook $\Gamma_l(D,\delta)$ for every l and a fixed $\delta > 0$. The code set and the error set are defined as follows where the terms R and $P_e$ are determined by $\delta$, D. It is assured by similar reasoning to that of Ornstein Shiels [OS-90] or as presented above that all codes obtained by the algorithm with rates $R > R(D)$ have an error probability such that $$\lim_{l \to \infty} P_e(D, l) = 0.$$

We denote that the code $$\Gamma_l(l,D,\delta) = \{\bar{v} | Pr(\bar{v}) \geq exp(-l(R(D)+\delta))\} \quad (15)$$

The set $\Gamma hd\ l(D,\delta)$ is the set of all l length codewords with probability exceeds a given threshold $e^{-l(R(D)+\delta)}$. The rate R of the Codebook $\Gamma_l$ is clearly larger than R(D). The error set is, $$Error(l, \delta, D) = \left\{ \bar{u} \left| \min_{-:\rho(\bar{u},\bar{v}) \leq D \atop \bar{v}} -\frac{1}{l}logPr(\bar{v}) - R(D) > \delta \right. \right\} \quad (16)$$

The set Error consists all sourcewords $\bar{u}$ for which all elements in their D-Ball have probabilities below the threshold. The rate distortion function R(D) is the minimal entropy induced on the codewords by an acceptable partition as l tends to infinity as explained above and [Sa]. It comes out that at the limit as l tends to infinity we obtain that, $$\lim_{l \to \infty} Pr\{Error\} = 0. \quad (17)$$

Clearly, we define the set $Error^c$ as, $$Error^c(\delta, l, D) = \left\{ \bar{u} \left| \min_{-:\rho(\bar{u},\bar{v}) \leq D \atop \bar{v}} -\frac{1}{l}logPr(\bar{v}) - R(D) \leq \delta \right. \right\} \quad (18)$$

Step 3

At this step we start to consider the algorithm in scheme A. At first we present the following identities, $$\lim_{l \to \infty} \frac{log D N_l(\bar{u}, v_{-\infty}^{-1})}{l} = \lim_{l \to \infty} \frac{log \min_{-:\rho(\bar{u},\bar{v}) \leq D \atop \bar{v}} N_l(\bar{v})}{l} = \lim_{l \to \infty} \min_{-:\rho(\bar{u},\bar{v}) \leq D \atop \bar{v}} \frac{log N_l(\bar{v})}{l}.$$

By similar reasoning as in the preceding lemma, the random blocklength guarantees that the output process v is stationary and ergodic after sufficient time has elapsed. Thus, we can apply the extended Kac Lemma (1) (2) (3). We identify the set $B = D\text{-Ball}(\bar{u})$. We fix the blocklength to a specific value l. The extended Kac lemma yields, $$E\left\{ \min_{-:\rho(\bar{u},\bar{v}) \leq D \atop \bar{v}} N_l(\bar{v}) \left| l, \bar{u} \right. \right\} \cdot Pr\{D\text{-Ball}(\bar{u}) | l\} = 1. \quad (19)$$

It is known that by a blockcoding such as described above and the preceding steps or as described in [Sa], the entropy of the database process attains the bound R(D). However, R(D) is uniquely determined by the source statistics, the distortion measure and D. Hence, each triplet $D,\delta,l$ defines a partition to two sets on the codewords space as in (15), and to two sets on the sourcewords space as in (16). The stationarity of v guarantees the possibility of such partitions for every l. Thus, for all $\bar{u} \in Error^c(D,\delta,l)$ at least one codeword in the selected code, $\bar{v} \in \Gamma$, is included in D-Ball($\bar{u}$). Thus, using the definition of the code in (15), for all $\bar{u} \in Error^c(D,\delta,l)$, $$Pr\{D\text{-Ball}(\bar{u}) | l\} \geq exp(-l(R(D)+\delta))$$

Since the database is a stationary ergodic process, we obtain by (19), given a fixed l, for all $\bar{u} \in Error^c(D,\delta,l)$, $$E\left\{ \min_{\bar{v}: \rho(\bar{u},\bar{v}) \leq D} N_l(\bar{v}) \left| l, \bar{u} \right. \right\} \leq exp(l(R(D)+\delta)) \quad (20)$$

The expected value given the whole set $\bar{u} \in Error^c(D,\delta,l)$ is bounded by the worst case value, $$E\left\{ \min_{\bar{v}: \rho(\bar{u},\bar{v}) \leq D} N_l(\bar{v}) \left| length = l, \bar{u} \in Error^c(D, \delta, l) \right. \right\} \leq exp(l(R(D)+\delta)). \quad (21)$$

Next we pick a l length string $\bar{u}$ from the input process u. We show that given the database $u_{-\infty}^{-1}$ we obtain a compression ratio that converge in probability to R(D). We abbreviate the notation $N_l(\bar{v}, v_{-\infty}^{-l})$ as $N_l(\bar{v})$. Recall the Markov's inequality that states: for a positive random variable Y, $$Pr\{Y \geq a\} \leq \frac{E(Y)}{a}.$$

Using Markov's inequality and (21) yield for $\beta > 0$, $$Pr\left\{\min_{\bar{v}:\rho(\bar{u},\bar{v})\leq D} \frac{\log N_l(\bar{v}, v_{-\infty}^{-1})}{l} \geq R(D)+\beta \middle| \text{length}=l, \right.$$
$$\left. \bar{u} \in \text{Error}^c(\delta, l, D)\right\} = $$
$$Pr\left\{\min_{\bar{v}:\rho(\bar{u},\bar{v})\leq D} N_l(\bar{v}) \geq \exp(l(R(D)+\beta)) \middle| \text{length}=l,\right.$$
$$\left. \bar{u} \in \text{Error}^c(D, \delta, l)\right\} \leq$$
$$\frac{E\left\{\min_{\bar{v}:\rho(\bar{u},\bar{v})\leq D} N_l(\bar{v}) \middle| \text{length}=l, \bar{u} \in \text{Error}^c(D, \delta, l)\right\}}{\exp(l(R(D)+\beta))} \leq e^{-l(\beta-\delta)}.$$
(22)

We now write for $\delta > 0$.

$$Pr\left\{\min_{\bar{v}:\rho(\bar{u},\bar{v})\leq D} \frac{\log N_l(\bar{v})}{l} \geq R(D)+\beta \middle| \text{length}=l\right\} =$$
$$Pr\{\bar{u} \in \text{Error}^c(D, \delta, l) | \text{length}=l\} Pr$$
$$\left\{\min_{\bar{v}:\rho(\bar{u},\bar{v})\leq D} \frac{\log N_l(\bar{v})}{l} \geq R(D)+\beta \middle| \text{length}=l, \bar{u} \in \text{Error}^c\right\} +$$
$$Pr\{\bar{u} \in \text{Error}(\delta, l) | \text{length}=l\} Pr$$
$$\left\{\min_{\bar{v}:\rho(\bar{u},\bar{v})\leq D} \frac{\log N_l(\bar{v})}{l} \geq R(D)+\beta \middle| \text{length}=l, \bar{u} \in \text{Error}\right\} \leq$$
$$Pr\left\{\min_{\bar{v}:\rho(\bar{u},\bar{v})\leq D} \frac{\log N_l(\bar{v})}{l} \geq R(D)+\beta \middle| \text{length}=l, \bar{u} \in \text{Error}^c(\delta, D, l)\right\} +$$
$$Pr\{\text{Error}(\delta, l) | \text{length}=l\}.$$

Since (22), $$Pr\left\{\min_{\bar{v}:\rho(\bar{u},\bar{v})\leq D} \frac{\log N_l(\bar{v})}{l} \geq R(D)+\beta \middle| \text{length}=l\right\} \leq e^{-l(\beta-\delta)} + P_e(l, \delta, D). \quad (23)$$

(23)
Using (17) and setting $\delta = \beta/2$ yields for all $\beta > 0$.

$$\lim_{l \to \infty} Pr\left\{\min_{\bar{v}:\rho(\bar{u},\bar{v})\leq D} \frac{\log N_l(\bar{v})}{l} \geq R(D)+\beta \middle| \text{length}=l\right\} = 0$$

which is half of the theorem. The second half follows from the general property of R(D) as the minimum attainable compression ratio. If $$\lim_{l \to \infty} Pr\left\{\min_{\bar{v}:\rho(\bar{u},\bar{v})\leq D} \frac{\log N_l(\bar{v})}{l} \leq R(D)-\beta \middle| \text{length}=l\right\} > 0$$

then it is possible to compress the input more than the bound R(D) in contradiction to the drfinition of R(D) as a minimum. It follows that in probability, $$\lim_{l \to \infty}\left\{\frac{\log DN_l(\bar{u}, v_{-\infty}^{-1})}{l} \middle| \text{length}=l\right\} = R(D). \quad \square$$

Corollary:
Due to Stationarity Lemma, the concatenated database is still stationary. Thus, we can repeat on the same arguments, apply the Extended Kac Lemma and obtain minimal entropy R(D) on the output v. In each assignment step, the concatenated block does not increase the overall ontropy rate it remains R(D). The practical result is that we can proceed working with Scheme A.

Limit Theorem A can be stated as follow. Given is a D-semifaithful database $v_{-n}^{-1}$ generated by Scheme A. The database size n is exponential with Len. Assuming Len tends to oo, then for l-length sample sequence $\bar{u}$ taken from a stationary ergodic process u, in probability $$\lim_{l \to \infty}\left\{\frac{\log DN_l(\bar{u}, v_{-\infty}^{-1})}{l} \middle| \text{length}=l\right\} = R(D). \quad (24)$$

The correctness of the statement follows from the fact that has been proved above. The optimal blockcoding converges almost surely to R(D). If there is no matching, the blockcoder almost surely concatenate to v a block with entropy R(D). If there is a matching, then in probability the concatenated block entropy will not exceed the entropy rate of the current database which is after sufficient time R(D). Hence, Scheme A can perform successfully from the beginning and attain the bound R(D).

Consequently we can proceed without assuming the existence of a certain separated optimal block coder. The block coding is a part of Scheme A, even though after sufficient time it is idle and we have only approximate string matching Turing machine.

Theorem on the Performance of Scheme A:
Given is a D-semifaithful database $v_{-n}^{-1}$ generated by Scheme A. The database size n is exponential with Len. As Len tends to oo, then for stationary ergodic process u, the compression ration attains the bound R(D) in probability.
Proof:
Following Limit Theorem A and its corollaries, after infinite time the "bootstrap" stage is completed and the database is an ergodic and stationary process. All rare strings that have some positive probability have already occurred and the probability of NO-MATCH is zero.

The number of bits required to encode the l-length string $\bar{u}$ by specifying the pointer $DN_1(\bar{u}, v_{-n}^{-1})$ is log $(DN_1(\bar{u}, v_{-n}^{-1})) + O(\log\log(DN_1(\bar{u})))$—as proved by Ellias [E1-75] for the pointer, and the number of bits required to encode l is log Len for any blocklength l.

The compression ratio of scheme A is a random variable that depends on the blocklength of each assignment. The blocklength is a random variable uniformly distributed with pmf q(l)=

$$\frac{1}{Len}.$$

Clearly, the events of a specific blocklength are mutually exclusive. Next we show that the probability of a compression ratio larger than $R(D)+\beta$ vanishes as Len tends to infinity. The term $$\frac{\log Len}{l},$$

the contribution of the random blocklength, vanishes at the limit since, $$\lim_{Len\to\infty} E_l \frac{\log Len}{l} = \lim_{Len\to\infty} \frac{1}{Len} \sum_{l=1}^{Len} \frac{\log Len}{l} = 0.$$

Thus, it does not contribute to the asymptotic value of the compression ratio. The compression ratio at the limit is described by the contribution of the pointer only. Using (23) we obtain, $$\lim_{Len\to\infty} Pr\{\text{Compression Ratio} \geq R(D) + \beta\} = \qquad (25)$$

$$\lim_{Len\to\infty} \sum_{l=1}^{Len} Pr\left\{\min_{\bar{v}:\rho(\bar{u},\bar{v})\leq D} \frac{\log N_l(\bar{v})}{l} \geq R(D) + \beta \middle| \text{length} = l\right\} Pr(l) \leq$$

$$\lim_{Len\to\infty} \frac{1}{Len} \sum_{l=1}^{Len} \{e^{-l(\beta-\delta)} + P_e(l, \delta, D)\}.$$

Using (17) and known results from calculus, setting $\delta = \beta/2$ yields for all $\beta > 0$, $$\lim_{Len\to\infty} Pr\{\text{Compression Ratio} \geq R(D) + \beta\} = 0.$$

Next we show that if $$\lim_{Len\to\infty} Pr\{Compression\ Ratio \leq R(D) - \beta\} > 0$$

for positive $\beta$, then it is possible to compress the input more than the bound $R(D)$ in contradiction to the definition of $R(D)$ as a minimum. It follows that in probability, $$\lim_{Len\to\infty} \{Compression\ Ratio\} = R(D). \quad \square$$

Since blockcoding is not practical in reality we propose the following scheme. It is not guaranteed to attain the bound, but it is more practical.

Data Compression Scheme A:
1. Choose a number 1 from an independent generator of random integers uniformly distributed with pmf $$q(l) = \frac{1}{Len},$$

t=1,2, . . . Len. Transmit the chosen integer l.
2. Choose a string $\bar{u} = u_0^{l-1}$ of length l.
3. If $u_0^{l-1}$ can be approximately matched up to tolerance D by a substring of $v_{-n}^{-1}$, encode it by specifying $DN_l(\bar{u}, v_{-n}^{-1})$. Append string $v_{-DN_l}^{l-1-DN_l}$ to database at position 0.
4. If not, append to the database the string $v_0^{l-1}$, which satisfies $\rho(u_0^{l-1})=0$.
5. Add a bit as a flag to indicate if there is a match or not.
6. Repeat the process from step 1, with a new string of randomly chosen length and a database $v_{-n+1}^{l-1}$. shift the indices by 1 to the appropriate value.

The scheme has two modes of operation. If there is an approximate matching the database is augmented by a string and concatenated. Otherwise, the mode of "bootstrap" append a zero distorted image of the input string. After sufficient time the probability of no approximate matching (NO-Match event) decays to zero. After the database is sufficiently large, we have a Turing machine with infinite memory that performs an approximate string matching only. When we discuss practical applications we prefer to use this scheme even though it is not optimal. However, at the limit the two machines are the same Turning machines with slightly different databases.

A degenerate version of the preceding scheme is the following one wherein the blocklength is fixed.

Approximate Fixed Length String Matching—Data Compression Scheme:
1. Choose a string $u_0^{l-1}$ of length l.
2. If $u_0^{l-1}$ can be approximately matched up to tolerance D by a substring of $v_{-n}^{-1}$, encode it by specifying $DN_l(v_{-n}^{-1})$. Append the string $v_{-DN_l}^{l-1-DN_l}$ to the database at position 0.
3. If not, append to the database track the string $v_0^{l-1}$, which satisfies $\rho(u_0^{l-1}, v_0^{l-1})=0$. In this case there is not reduction in the number of symbols.
4. Add a bit as a flag to indicate if there is a match or not.
5. Repeat the process from step 1, with a string $\bar{u}=u_l^{2l-1}$ of length l and a database $v_{-n+l}^{l-1}$. Shift the indices by 1 to the appropriate values.

Figure 2:
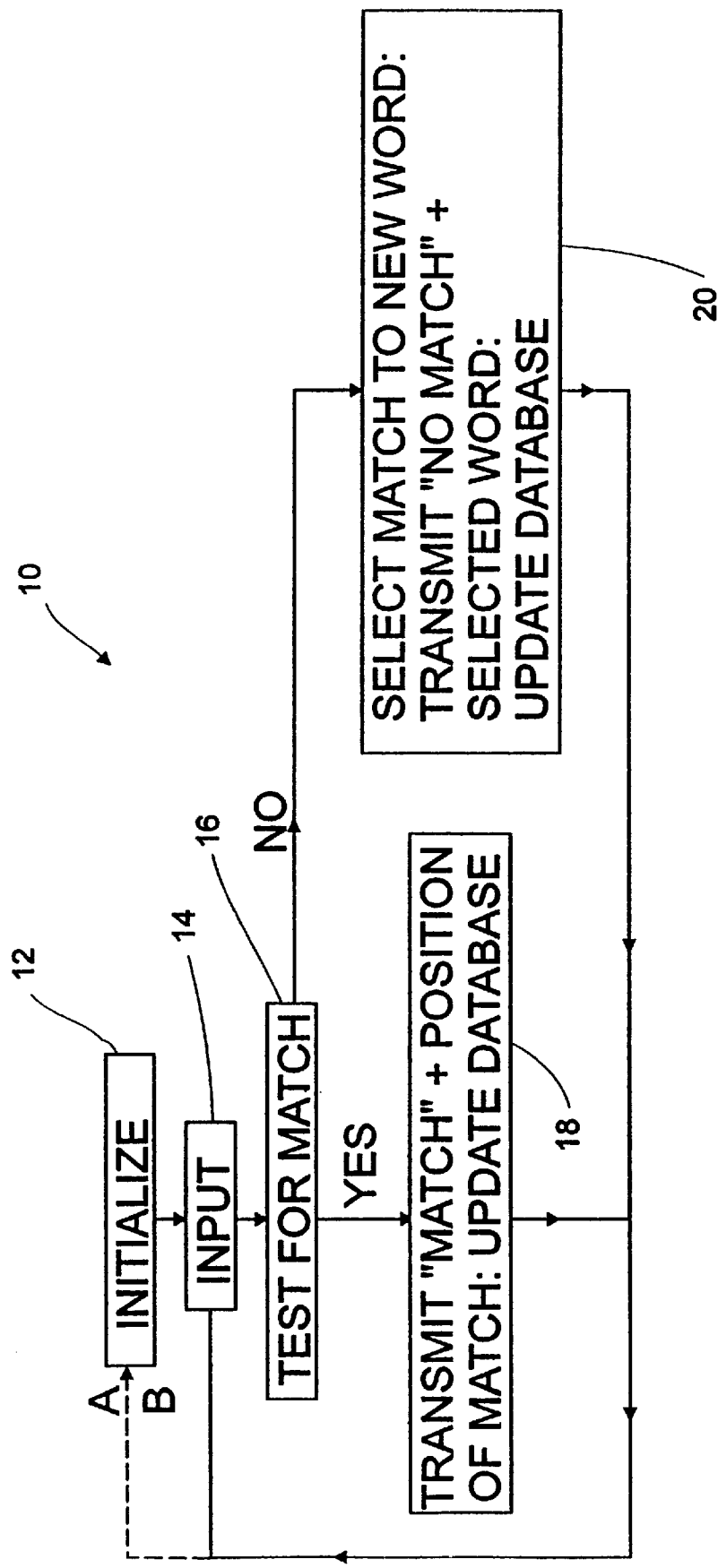
FIG. 2 is a block diagram of a first method for lossy compression of data, including a step of searching within a database, the method being operative according to the teachings of the present invention.

Turning now to FIG. 2, there is shown a method, generally designated 10, according to schemes A and $\bar{A}$. Method 10 starts at block 12 in which the system is initialized. This includes the setting of database $v_{-n}^{-1}$ to an initial setting and the setting of a string length l. Then at block 14, a string of length l of t characters of the source data $u_0^{l-t}$ is inputted. At block 16, a search is performed through the database, starting with the most recently added record, for a substring corresponding within a given average distortion tolerance level per character to string $u_0^{l-1}$. If a match is found, method 10 proceeds to block 18 at which string $u_0^{l-1}$ is encoded by a flag indicating the finding of a match, and the position of the match within the database. The database is updated by appending thereto the matched substring as $v_0^{l-1}$ and reindexing the database. If no match is found, the method proceeds to block 10 at which string $v_0^{l-1}$ is encoded by a flag indicating the non-finding of a match, and a new database substring $v_0^{l-1}$ corresponding within the given average distortion tolerance level per character to string $u_0^{l-1}$. The database is updated by appending thereto the new database substring $v_0^{l-1}$ and reindexing the database. After block 18 or block 20, method 10 repeats. In the case of scheme A, method 10 returns to part of block 12, such that string length l is reset randomly for each loop. In the case of Scheme $\bar{A}$, method 10 returns to block 14, string length l remaining constant between loops.

Figure 3:
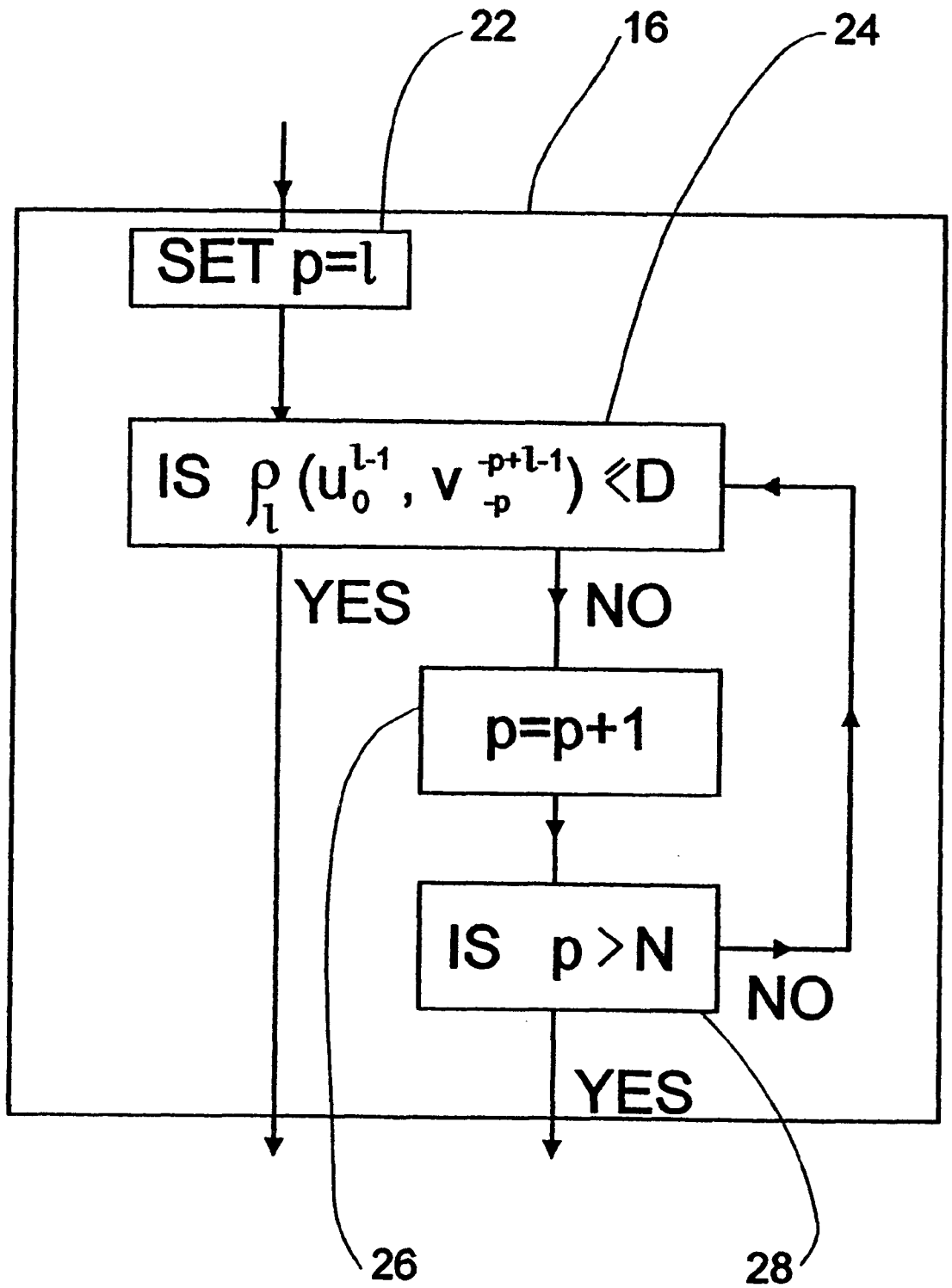
FIG. 3 is a block diagram of an algorithm for use in the step of searching within a database of FIG. 2.

FIG. 3 shows details of block 16 in which a counter $\rho$ is initially set to value 1 (block 22) and used to select a first database substring. The average distortion level per character between the source data string and the database substring is then calculated according to equation 4 above (wherein $\bar{u}=u_0^{l-1}$ and $\bar{u}=u_{-p}^{-p+l-1}$), and compared with the required value D (block 24). If a match is indicated, method 10 proceeds to block 18. If a match is not indicated, a pointer $\mu$ is incremented (block 26), and compared to the size of the database N (block 28). If the end of the database has not yet been reached, method 10 returns to block 24. When the end of the database is reached, method 10 proceeds to block 20.

3.3.4 Quasi Parsing Data Compression

We present an extension of Lempel-Ziv compression scheme. The machine is based on a quasi parsing procedure which creates a new phrase as soon as a prefix of the still unparsed part of the input sequence u differs from all substrings in database v by more than D per letter. Encoding each input phrase consists the pointer N to the last approximately matched string, the string length $DL_n$ and the last reproducing letter with zero distance from the last input symbol.

Scheme B:
1. l=1.
2. Choose a string of length 1 $u_0^{l-1}$.
3. If $u_0^{l-1}$ can be approximately matched up to tolerance D by a substring of $v_{-n}^{-1}$, store a pointer N to that substring and increment l. Go to step 2.
4. If not, append to the data base track the string $v_{-N}^{l-2-N}$ at position zero and further, and append the letter $v_{l-1}$, the reproducing letter which satisfies $d(u_{l-1}, v_{l-1})-0$. The encoding is done by the pointer to the string $v_{-N}^{l-2-N}$, the length $DL_n(u)$ and the last reproducing letter associated to the last source letter.
5. Repeat the process from step 1, where the data base is appended with the chosen string denoted $v_0^{DL_n}$. The data base contains now $N+DL_n(u)$ reproducing symbols. Shift the indices to adapt to the algorithm.

This scheme has only one mode of operation and it does not require a block coder which is hard to implement. Thus, it is more attractive than Scheme A. The entire processing is repeated each time with the database augmented with the new generated block $v_0^{DL^n}$ which is known to the decoder also. Note that the scheme is universal in that the encoder does not have to know the source statistics to perform its task.

Limit Theorem B:

Let u be a stationary ergodic process defined on an alphabet U. Given is a database $v_{-n}^{-1}$ generated by an encoder-decoder pair as described in scheme B, with fidelity criterion of distortion D. As the memory size-n tends to infinity, for a new sample sequence $\bar{u}$ taken from the input u, in probability, $$\lim_{n \to \infty} \left\{ \frac{\log n}{DL_n(\bar{u}, v_{-n}^{-1})} \right\} = R(D). \tag{26}$$

Proof:

$$\lim_{n \to \infty} Pr\left\{ \frac{\log n}{DL_n(\bar{u}, v_{-n}^{-1})} \geq R(D) + \delta \right\} = \lim_{n \to \infty} Pr\left\{ \frac{\log n}{R(D) + \delta} \geq DL_n(\bar{u}, v_{-n}^{-1}) \right\}$$

We choose $$l = \frac{\log n}{R(D) + \delta}$$

and apply the Duality Lemma (5) and the Limit Theorem A (6) and (24), $$\lim_{n \to \infty} Pr\left\{ \frac{\log n}{R(D) + \delta} \geq DL_n(\bar{u}, v_{-n}^{-1}) \right\} =$$

$$\lim_{n \to \infty} \{DN_l(\bar{u}, v_{-\infty}^{-1}) > n\} = \lim_{n \to \infty} Pr\left\{ \frac{\log DN_l(\bar{u}, v_{-\infty}^{-1})}{l} > \frac{\log n}{l} \right\} =$$

$$\lim_{l \to \infty} Pr\left\{ \frac{\log DN_l(\bar{u}, v_{-\infty}^{-1})}{l} \;\middle|\; length = l > R(D) + \delta \right\} = 0. \quad \square$$

Theorem on Performance of Scheme B:

Given a maximum average distortion $D \geq 0$ and database size $n \to \infty$, the quasi parsing data compression scheme attains the bound R(D) in probability.

Proof: The construction procedure of the process v is done in a recursive way. In each iteration a new block is appended to the output track. Each block is exactly defined by the pointer to the interval $(-1, -n-DL_n)$, the length $DL_n$ and the last reproducing letter. The pointer requires log n bits, the length $DL_n$ can be encoded as proved by Rodeh, Pratt and Even [RPE-81] by $\log DL_n + O(\log\log DL_n)$ bits (when the length is large enough) and the last symbol requires at most $\log(|V|-1)$ bits (since one letter can be excluded). Thus the average number of bits required to encode $DL_n$ length string in the scheme is $$\log(n-DL_n) + \log DL_n + \log(|V|-1) + O(\log\log DL_n).$$

The number of bits per source symbol with compression in therefore, $$\frac{\log(n - DL_n) + \log DL_n + \log(|V| - 1) + O(\log\log DL_n)}{DL_n} \approx \tag{27}$$

$$\frac{\log(n) + O(\log DL_n(\bar{u}))}{DL_n(\bar{u})}.$$

As the database size tends to infinity we obtain the result of possible compressibility from (26). Thus for large n in probability $$\lim_{n \to \infty} \frac{\log(n) + O(\log DL_n(\bar{u}))}{DL_n(\bar{u}, v_{-n}^{-1})} = R(D).$$

Thus, the compressibility of the output process after long time is R(D), or similarly the entropy of the process v is minimized to the optimal bound asymptotically with respect to the fidelity constraint. This is an important result that is paving the way for our new practical algorithms that achieve the theoretical bound R(D). On the other hand these results give a new and conceptually simple way of estimating the rate distortion function of an ergodic stationary source with arbitrarily chosen D.

3.4 PRACTICAL CONSTRAINTS

In practical realizations of the above algorithms, the database size is held fixed and also the blocklength of the strings are finite. These constraints causes deviations from the asymptotic results.

3.4.1. Scheme A Under Constraints

Under limited database memory constraint there is a finite probability that the chosen strings would not be matched by any subsequence in the database. We define this even as NO-MATCH. Clearly, Pr(NO-MATCH)=1−Pr(MATCH). The NO-MATCH set is the set of sourcewords $\bar{u}$ such that on average none of the codewords $\bar{v}$ contained in the D-Ball around $\bar{u}$ are matched in the finite database. That is, $$NO - MATCH(n, l, D) = \left\{ \bar{u} \;\middle|\; E \min_{-:\rho(\bar{u},\bar{v}) \leq D} N_l(\bar{v}) > n - l \right\}. \tag{28}$$

The first issue is how to construct the database once it is filled. What is the best policy to remove data? The answer is FIFO, as explained here.

Theorem on Limited Memory Constraint:

Under limited memory constraint and without empirical data, the best policy is to cut the tail of the data base. That policy minimizes the average NO-MATCH probability.

Proof: According to the Kac Lemma $$[Ka\text{-}47] E_N N_l(\bar{v}) = \frac{1}{Pr(\bar{u})}.$$

Thus, the tail of the database consists either the least probable subsequence on average, or strings that appear in some other part of the database and therefore they are useless. Any other policy of cutting other segment in the database would increase the average NO-MATCH probability.

Next, we apply the Extended Kac Lemma (1) (2) (3) to (28), $$NO\text{-}MATCH(n, l, D) = \left\{ \bar{u} \middle| \max_{\substack{-:\rho(\bar{u},\bar{v}) \leq D \\ \bar{v}}} Pr(\bar{v}) < \frac{1}{n-l} \right\} \tag{29}$$

It is easy to see that the NO-MATCH set is identical to the ERROR set in the partition algorithm where the threshold probability is $$p_t = \frac{1}{n-l},$$

as defined above the discussion on memoryless source blockcoding and elsewhere there.

For i.i.d. and Markovian source it is possible to show as was done in chapter 2 section 5 and [Sa] that there exists $n(l, D)$ such that for $n > n(l, D)$, the NO-MATCH probability decays exponentially with $l$. That is, $$Pr(NO\text{-}MATCH) \approx \begin{cases} 1, & \text{if } n < n(l, D); \\ \exp(-lF(n, D)), & \text{otherwise.} \end{cases} \tag{30}$$

where the function $F(n, D)$ is positive and increasing in both n and in D. We will omit the full proof since it is the same as given above, sections 2.5.1 to 2.5.3, where the value $p_t = e^{-lR(D)+\delta}$ should be replaced by $$p_t = \frac{1}{n-1}.$$

We can give a full expansion of the No-Match probability using large deviations theory as given above.

Theorem:

Considering schemes A and $\bar{A}$ with database size n, then the average number of bits per source symbol required to encode l string in the scheme after long time is $$Pr(MATCH)\left( E_u \log(DN_l(\bar{u}, v_{-n}^{-1})) + \frac{O(\log\log(DN_l(\bar{u}, v_{-n}^{-1})))}{l} \right) + \tag{31}$$

$$Pr(NO\text{-}MATCH) \cdot \log|V| + \frac{1}{l}$$

Proof: The source u is ergodic and stationary. Hence, the average of $\log DN_l(\bar{u}, v_{-n}^{-1})$ after long time tends to the expected value $E_u \log DN_l(\bar{u}, v_{-n}^{-1})$. If there is a matching the number of bits required to encode the string $\bar{u}$ by specifying $DN_l(\bar{u})$ is $\log(DN_l(\bar{u})+O(\log\log(DN_l(\bar{u})))$ as proved by Elias [E1-75]. Otherwise, $l\text{-}\log|V|$ bits are required to encode without compression. An additional bit is required to indicate if a match has occurred. Hence (3).

Theorem:

Consider Scheme A with database size n polynomial with Len. As Len→∞, the average number of encoded bits per source symbol in the scheme is in probability $$Pr(MATCH) \cdot R(D) + Pr(NO\text{-}MATCH) \cdot \log|V|. \tag{32}$$

Proof: As proved in Limit Theorem A (6) and (24) and as a direct consequence of (31) the expected value of the first term in (31) tends to the limit R(D). The last term in (31) vanishes as l→∞.

Theorem on the Finite Blocklength Case:

Given is a large data base in >>1 exponential with Len. For sufficiently large blocklength range Len, the number of encoded bits per source symbol in scheme A converges in probability to, $$R(D) + O\left(\frac{\log Len}{Len}\right). \tag{33}$$

Proof: $Pr(MATCH) \approx 1$ for large n exponential with Len. We use Elias [E1-75] result and the limit theorem A in (6) and (24) (25). Hence, in probability, $$\lim_{l \to \infty} \left( \frac{\log DN_l(\bar{u}, v_{-n}^{-1})}{l} \right) = R(D)$$

and $$O\left( \frac{\log\log(DN_l(\bar{u}))}{l} \right) = O\left( \frac{\log l}{l} \right).$$

But l is randomly chosen in a finite rand 1...Len. The result is obtained by taking the expected value and direct substitution in (31).

3.4.2. Rate of Convergence of Scheme B

For practical data compression the dimension of the database must be determined since memory is limited. After a while the database size is held fixed. This constraint imposes that we are closed to R(D) but cannot achieve it. We are interested to find the convergence rate in probability of the accepted rate to R(D) as a function of database length n.

Theorem:

For sufficiently large database n>>1 the number of encoded bits per source symbol in Scheme B is in probability approximately, $$R(D) + O\left(\frac{\log\log n}{\log n}\right). \tag{34}$$

Proof: Because of similar reasoning to (27), the number of bits per source symbols is in probability, $$\frac{\log(n - DL_n) + \log DL_n + \log(|V|-1) + O(\log\log DL_n)}{DL_n} \approx \tag{35}$$

$$\frac{\log(n) + O(\log DL_n(\bar{u}))}{DL_n(\bar{u})}.$$

As the database size grows, following (26), $$\frac{\log(n) + O(\log DL_n(\bar{u}, Q))}{DL_n(\bar{u}, Q)} \approx R(D) + O\left(\frac{\log\log n}{\log n}\right) \quad \square$$

The practical meaning is that without any prior information a large database is required to be closed to R(D). To handle practical design problems it is not enough to know that the performance of the algorithm converges to the optimum; one should know also about the finite database performance of such machine.

To put the numbers in (34), we obtain that in order to attain in probability an accuracy of 0.01 from the limit, one needs a database of approximately $2^{1000}$ symbols. To guarantee in probability a compression ratio in the range of 0.1 from the limit, one needs approximately $2^{64}$ symbols in database. Therefore, any possibility to accelerate the converges is important for practical application. However, the practical experience with Lempel-Ziv algorithm shows better convergence rate. Thus, we may hope for better convergence rates than the theoretical results. Special cases where there is a prior information and/or there is a Markov property and/or some kind of periodicity will certainly reduce the size of database and accelerate the convergence to R(D).

3.5. CONCLUSIONS

In this chapter we obtain theorems concerning the approximate string matching algorithms and its relations to the rate distortion function R(D) of a stationary ergodic source. We use these results to yield insight into our new data-compression schemes. Moreover, these results give a new and conceptually simple way of estimating the rate distortion function of an ergodic stationary source with arbitrarily chosen D. The basis for our theory is the extension of Kac Lemma to an approximate string matching of stationary source. We use it for convergence proofs.

We propose two practical universal source coding schemes based on approximate string matching. One is an approximate random-length string matching data compression, and the other is LZ-type quasi parsing method by approximate string matching. It is shown in this chapter, that in the former algorithm the compression rate converges to the theoretical bound of R(D) for ergodic and stationary processes as the average string length tends to infinity. A similar result holds for the latter algorithm in the limit of infinite database size. We evaluate the performance of the two algorithms in practical cases where data base size is finite and where the string length is finite. In addition we prove some asymptotic properties concerning the workings of an approximate string matching algorithms for ergodic stationary source.

Our algorithms are supposed to be the first and probably the only universal algorithms that attain the bound R(D). This is actually the first solution of Shannon-Berger problem which asserts their existence but could not construct them. In particular, Scheme B, which is the extension of Lempel-Ziv algorithm is important. It is universal in that the encoder does not need to know or to compute the source statistics to perform its task.

The weak point is the slow convergence to R(D). However, in practical cases we believe the rate of convergence is faster. In fact, this is the same situation as in Lempel Ziv algorithm. In real life, there exists properties such as Markovity, periodicity and/or some a priori information about the signal. In such cases the experience with Lempel-Ziv algorithm is paving the way for practical solutions.

Other important properties of the algorithms are:
1. Optimality is obtained for a general stationary ergodic source.
2. Optimality is obtained for all distortion measures and not only MSE (Mean Square Error) or Hamming distance.
3. Easily adapted to MultiMedia applications, mainly in real time.
4. Lempel Ziv algorithm (CCITT Standard) is recovered as D=0.
5. Realization with relatively low complexity and implementation with a dynamic dictionary.
6. The original definition of the distortion measure which enables a reduction of the information content of a video/voice record while keeping a minimal visual/audio distortion. The subject is covered in the next chapter.
7. Sub-optimal tree-structure algorithms are proposed. (in the next chapter).
8. Benefits of noise reduction, enhancement and scaling, especially where a priori information is available.

We believe that these algorithms are possible candidates for International CCITT and/or FCC standards. Our statement is based not only on the theory, but also on practical results as will be discussed in the next chapter. The most common methods for lossy compression are based on predictive coding (DPCM), transform (such as DFT, DCT, DST, WHT, wavelet, Haar and others), and vector quantization, with possible hybrid combinations. Most of them lack any general proof of optimality. Most of them use some kind of MSE criteria or data compression is achieved by coding only "high energy" coefficients in their transform. Moreover, almost all of these techniques are not real time algorithms. All transform coding methods are performed after the signal is received not in real time. Our objective was to seek algorithms which achieve optimal universal compression performance with limited resources in real time. We believe we have realized it.

SUBOPTIMAL IMAGE AND VOICE COMPRESSION

Data compression is a general process of transforming a body of data to a smaller representation from which the approximation to the original can be reconstructed. Lossy compression of information is most useful for digitized data such as voice, image, video, where some information may be lost since only the perceived quality of the reconstructed data is important. We study a tree structure suboptimal method for lossy data compression in computer networks.

4.1. IMAGE AND VOICE COMPRESSION

Efficient compression methods and algorithms are required in every modern multimedia system. The development of communication systems is ever becoming more sophisticated. A vast increase in computational power is now available and is used within communication terminals to enhance performance. Now, however, electronics is cheap, but power and bandwidth in channels are resources to be conserved. The winning design of multimedia system will be the design that transmits with lower power at higher rates and with fewer errors; greater hardware complexity is a penalty that can be accepted.

We present a suboptimal algorithm which has better compression performance, while the distortion in the image or in the voice record is indistinguishable by the human eye or ears.

The algorithm is similar for voice compression and image compression. We'll treat the more complicated case which is the image compression. For simplicity we assume a binary image. The expansion to multi-color and/or multi-grey levels is quite straight forward. In case of a 3-D or 4-D (including the time coordinate), the method can be applied by just changing the definitions to the proper dimension.

The binary case is in practice the case of FAX processor (such as National NS32FX16), other facsimile applications, Laser Printers, some graphic applications and so on.

In the following algorithm we take advantage of the following properties:

1. The resolution of the human eye is limited.
2. Similar small figures seem to be the same in a human eye.
3. There is a high correlation between neighbors in the picture.
4. Usually, there are some typical patterns in images or voice records which are more frequent than others.
5. Changing a rare and small figure to a more frequent similar figure does not affect the image seriously.
6. All the possible changes can be "charged" according to a pre-defined "cost" table.
7. Such changes will contribute to better compression ratio.
8. Small tolerable distortion enables better compression (because the sharp decline of R(D) as D→0).

We define a set of "cells"—the generic structures—of the picture. For simplicity we define a cell to be a quad-structure of the four neighbors i.e. NE,NW,SW,SE. This symmetric structure is considered as the generator of 16 "cells" which are equivalent to letters in a alphabet. A change of each cell to another is charged according to their "visual distortion measures". These distortion measures should be determined by trial and error methods, according to the eye resolution ability.

Let d(s, t) define the visual distortion measure between a cell s to a cell t.

$$d(s, t)=0 \text{ iff } s=t \quad (1)$$

$$d(s, t)>0 \text{ iff } s \neq t \quad (2)$$

In our case $$d(s, t)=\max(|\#1 \text{ in } s - \#1 \text{ in } t|, \epsilon) \text{ iff } \delta \neq t \quad (3)$$

where $\epsilon$ is required to implement the lossless case as well. This is the small price that costs the transition between two cells with the same number of 1.

Unlike Hamming distance and the usual definition of a metric, the existence of the triangle inequality is not required.

We assume that the number of 1 in the cells and their relative locations determine the value of these coefficients. Eventually, the distortion coefficients d(s, t) reflect the physical limitations of the human eye. In a "fine" print on a sheet of paper each pixel represent about $10^{-4}$ cm$^2$, while the resolution of the human eye is much less. Therefore a swap of neighboring pixels is indistinguishable, and respectively should "cost" a cheap price. This means that a swap of pixels in $10^{-2}$ cm distance is equivalent to a change of one cell to another. Such transition should cost a minimal cost.

Another consideration in determining the coefficients is to cancel noise, which recently is represented by "illogical" patterns, such as a single 1 surrounded by 0. In this case we permit cheap transitions to more frequent patterns.

These coefficients should be masked on a ROM look-up table. The entries to the table are done by s and t. Other possibility is to compute them on the fly.

Consider all "cells" with the same number of "1" as a "basic letter". Each transition from one cell in such subset to another will cost negligible price $\epsilon$. Thus, in fact the number of basic letters in the new alphabet is dramatically reduced.

To emphasize why this simple trick is good, think about a binary image generated by a random source. By defining of 2×2 cells and the relevant "visual distortion measures" we actually reduce the number of letters from 16 to 5 basic letters with non-equal probabilities. By defining of 4×4 cells and the relevant "visual distortion measures" we actually reduce the number of letters from $2^{16}$ to 17 basic letters with non-equal probabilities. Thus, the entropy defined on the new "basic letters" is much less. The result in much better compression is obvious.

The advantage of our method over other metrics such as MSE is clear. There is no evidence that MSE is fitting to the human eye capabilities, while our method is designed for best fitting. For example, consider a "chessboard image" with 1-pixel squares and its negative replica. The distance between the two images is maximal (100%) according to MSE or similar metrics, while in our method the visual distance is very small. Actually, the human eye cannot distinguish between the two images. On the other hand, two images which seems different to the human eye, their mutual visual distance in our method is high.

The same ideas are useful for voice compression, while in that case the alphabet is defined on fixed length frames of samples, and the distortion measure is the absolute difference between their average values.

4.2. TREE STRUCTURE ALGORITHM

We want to avoid from doing a linear search for each phrase in the dictionary. The complexity in this case O(nl) with n the number of the words in the dictionary and l the length of the pattern. It could be improved slightly but it is still at least linear with n. Although we think the traditional definitions of complexity as worst case design are against the spirit of information theory, we would like to cope with a large images. Hence, we organize the dictionary in a data structure called a "hex tree". In a matter of terminology, the phrase "multi-branch structure" will be used herein in the description and claims to refer to a data structure in which each node can support more than two nodes branching therefrom, as distinct from a "binary tree structure".

The tree contains one "node" per distinct phrase, where each phrase is organized in levels according to the length of the phrase. Each node contains:

a pointer to the current phrase (optional)
    a counter that identify the order of the phrases in the data stream (optional)
    up to 16 positions to the children nodes
    a pointer to the father node or the index of the father.

The nodes are maintained so that at any node, all subtrees are created from the prefix defined on the node plus tree extensions. To find out whether a new phrase is already covered by a node in the trees, one starts at the father, and verify whether one of the D-balls created by the available sons cover the new phrase. If it is contained in one of the balls, the node turns to be the father and the process is repeated recursively with a new phrase created by concatenating a new cell to the phrase. If there is no child that covers the phrase in a D-ball, the new phrase is appended to the tree as the next child. Now, the process starts from the root of the tree with a new cell. It should be emphasized that the children in each node are ordered in the order of their appearance, first comes appended and first scanned. We try, always to cover a phrase with the first (the oldest) son, although its center might be not the the closes cover.

The D-balls are defined according to the order of scanning in the search process. Though, a new phrase will be appended to the child which comes earlier. Eventually, not all of the "D-balls" are distinct, but the algorithm always checks cover with the first "D-ball". The basic assumption is that a phrase that appears first is more probable and therefore preferred for the code. It is possible that the number of children in each node will be less than 16. It happens if a certain phrase doesn't appear or if it has already been covered by some other "D-ball".

The data structure at the receiver is also a tree. The tree requires some time at the expansion procedure to follow the pointers until the root, each time a new phrase is appended to the image. However, it is fast enough. In case of a tree database in the receiver, the pointers to the children are not essential because we don't have to execute "search" procedure. The expansion procedure is just the reconstruction of the phrase sequentially by stepping on the tree to the root. Each time a new cell arrives from the source, it is associated with pointer (or a displacement) from its father. Appending the new cell on the tree is naturally following the father node.

The database in this algorithm is arranged in a tree structure. We denote by $\bar{v}$ a phrase that has already been selected to be a node on the tree. Each node defines a sphere of radius D where iteratively a new phrase $\bar{u}$ is asked if it is contained in the sphere. The compression algorithm for a binary image is as follows, 1. Define a dictionary tree where the root is the null word. Number the root phrase as zero. Define the counter of phrases as zero. In the following procedure we build hex tree, not necessarily a full one.
2. Scan the image a cell after a cell sequentially. The path might be Hamiltonian, a raster scan or other. The Hamiltonian scanning is preferred. A raster scan has advantages in case of a paper of text written in a particular direction.
3. A new node is created if the current input phrase $\bar{u}$ differs from all the phrases located on the children-nodes of the current node on path, by more than D. That is, for all $\bar{v}$ in the l level of the subtree $$\rho_l(u_0^{l-1}, \bar{v}) = \frac{1}{l} \sum_{i=0}^{l-1} d(u_i, v_i) > D \tag{4}$$

where l is the phrase length, $u_i$, $v_i$ denote the pair of cells at the i position in the stream of cells after last parsing and a note $\bar{v}$ repectively, where i=0 stands for the first cell in the current phrase after parsing.

Denote $\rho_l(\bar{u}, \bar{v})$ the "distance" between l-length phrase $\bar{u}$ and a node $\bar{v}$ in the l level. Denote $\rho_{l-1}(\bar{u}, \bar{v}_f)$ the "distance" between a 1 . . . l-1-length prefix of $\bar{u}$ and the father node $\bar{v}_f$ in the l-1 level. To spend up the computation we use the recursive form which requires only one access to the look up table, $$\rho_l(\bar{u}, \bar{v}) = \frac{(l-1)\rho_{l-1}(\bar{u}, \bar{v}_f) + d(\bar{u}_l, \bar{v}_l)}{l} \leq D \tag{5}$$

The conditioned should be verified with all the children of $\bar{v}_f$.

4. Increment the counter of phases.
5. The new phrase is numbered j=countered of phrases and is appended to the tree as a son of the phrase which is its prefix with l-1 cells. In other words, the "son" phrase is generated by concatenating of the father with the last cell, such that the new phrase differs from all the other phrases in the subtree with the same length, in more than D.

The tree structure obtained after scanning the whole image is the compressed representation of the image.

A logical way to transmit the compressed data is to send the index (pointer) of the father of each phrase, plus its last cell. Such encoding method can create a distortion. The prefix with l-1 symbols is at most D far from the center of the D-ball where it is located. Thus, the new center in the l-level, is at most $$\frac{(l-1)D}{l}$$

far from the new member. This error is not accumulated and it is always less than D. Therefore it is guaranteed that also the expanded phrase in the receiver is, at most, D far from the real value, as required.

We formulate in a the following proposition.
PROPOSITION

The expansion average distortion per symbol due to the algorithm of a l-length phrase is bounded by $$\frac{(l-1)}{l} \cdot D$$

and the compression factor is in the worst case $$\frac{\lceil \log(M(n) - 1) \rceil + \lceil \log C \rceil}{l \lceil \log C \rceil},$$

where n is the number of the scanned cells, M(n) is the number of the nodes in the tree (the number of phrases) and C the size of the generated alphabet.

Proof

The prefix with l-1 cells is in the D-ball defined and encoded by its center. Thus, $$\frac{1}{l-1} \sum_{i=0}^{l-1} d(u_i, v_i) \leq D \tag{6}$$

The new phrase is encoded by a phrase which the father concatenated with the last cell. Therefore the last cell does not cause any error while the l-1 prefix contribute an error less than or equal to (l-1) D. The average distortion is bounded by $$D \frac{(l-1)}{l}.$$

The argument is valid for all phrases.

If we enumerate the nodes in the tree by an index j, the index is equivalent to the number of the phrases as appeared in the data stream. Therefore a phrase with l cells number $j \leq M(n)$ is compressed to one cell and an integer i<j, with at most $\lceil \log(j-1) \rceil$ bits. Each cell is encoded by $\lceil \log C \rceil$ bits (or nats).

PROPOSITION

The depth of the tree is bounded by $$\sqrt{1.5n}$$

where n is the number of the scanned cells.
Proof: The deepest tree is obtained in a one color image. Then, the arithmetic series is $$1+2+\ldots+\ldots+l+\ldots+depth=n \quad (7)$$

The result is derived immediately.
PROPOSITION

The minimal depth of the tree is approximately down bounded by $\log_c(C_n)$ where n is the number of the scanned cells and C is the size of the alphabet (16 in hex tree).
Proof: The shortest tree is obtained in a full balanced tree. Then, for the Case D=0, depth satisfies the equation $$C^1+2\neq C^2+\ldots+l\neq C^1+\ldots+depth\neq C^{depth}=n \quad (8)$$

$$depth+\log_C depth\approx \log_C(C_n) \quad (9)$$

The result follows from (9)

To put the real figures, a sheet of paper contains approximately $n\approx 10^6$ cells. The depth of the tree varies, in a hex tree, from 6 levels to 1200 approximately. Certainly, the deeper tree is better for comparison.

The expansion procedure at the receiver is quite simple. According to the number associated to each transmitted cell, the father is determined and the tree is reconstructed fastly in a recursive procedure. A new phrase is created by concatenating the transmitted cell to the phrase number i which is already in the tree. The new phrase is renumbered as j.

It should be emphasized that the scanning path at the encoder and the decoder must be the same. The path of the scanner in the encoder and in the decoder should be well defined and known in all the nodes on the communication network. This path can be changed from time to time and so to increase the privacy of the transmitted information. It is not reasonable that unauthorized receiver can break the code easily.

It is well known that every pixel is highly correlated to its neighbors. We may expect to get better compression ration in a Hamiltonian path of scanning. Although, also other paths will have a rather good compression as well. If there is a particular direction in the data, such as a direction of writing, a raster scan in that direction is preferred to find typical patterns. Our results obtained on a picture with some noise were much better than L-Z algorithm, even when the scanning was in a raster and the basic cell was just a set of eight consecutive pixels. As we changed the basic cell to 2×2 square the results were improved. We believe that by defining a 2-D cell with a proper definition of the visual distortion measures between cells, we can improve the performance of the algorithm significantly.

Possible Problems

1. Each "D-ball" is represented by its "center" which is determined by the first appearance of a member of the set. There is no further adaptive clustering.

2. The "children" are created by concatenating one cell at the end of the "natural father". But the "natural father", is not necessarily the center. Therefore the encoding by: the index of the "father" (not the "natural") and the extra cell creates a distortion.

3. There is no guarantee that the partition is optimal. Suppose all the members are concentrated in one side of "D-ball". Then, by a new definition of the center we may create a more probable "D-ball" and therefore improve the compression and/or reduce the distortion.

Possible Modifications

Best compression is achieved when the tree is long and thin. To modify the algorithm we have to include as many as possible words in the first D-balls, which are supposed to be more probable than the last ones in the same level. Besides, it is useful to define more accurately the center of each D-ball such that the l-length phrase with the least average distance from its neighbors will be considered as the center.

The data structure should be changed such that for each D-ball there will be counter that indicate which phrases were included and their frequencies.

The procedure should be started in a certain 1 level and from the most probable (the first) child, means the first child of the first father, etc.

The center of this D-ball is redefined and as many as possible new members will be appended to the set. Later, the same procedure will be done concerning the second "D-ball" and so on.

After completing the l-level, the same procedure is repeated 1+λ·level. This algorithm needs more time and more space. It could be executed as pass-2 on the "naive" tree compression.

2. We might change the algorithm such that each time a new center is defined for the D-ball. The new D-ball will contain the old members and the new one, if possible. Such dynamic clustering is hard to implement and it requires a large memory and time.

3. The procedures described below are ideal where no prior knowledge is available, since the algorithm is universal. No assumptions are needed about the source nature. In many practical applications, a prior information is available. In this case, say in facsimile transmission, a training stage could be useful for compression and filtering as well. A training stage might be to compress a clean sheet of paper with clear printing on it, or to define at the beginning, the first stages of the tree, in both sides, the transmitter and the receiver, a typical "background". If the centers of the "D-balls" are defined in the training stage on a perfect data base, later the noisy data will be filtered such that distorted patterns of consecutive cells will be related and encoded as the perfect patterns without the noise.

4.3 Real Time Considerations

The communications between junctions on the network can be done in two ways; either to send buffer content in bursts (which is off line processing) or to send the information in real time while the line is point to point and cost is relative to the time the channel is dedicated to this purpose.

Most old communications channels work in rates until 9600 baud. It means that in order to use the channel efficiently a processing time of each phrase should be about 2 msec for a codeword with 20 bits. The length of a codeword is changed according to the size of the data base. This fact impose constraints on the system.

We represent a few possible solutions.

1. To keep the line in idle position in some cases.
2. To limit the size of the data base, while in this way we might hurt the performance of the compression algorithm.
3. To enable some "errors".
4. To add special hardware in the bottleneck.

5. When there is some prior information about the typical nature of the transmitted information, "plant" in the receiver and the transmitter the trunk of the tree and some branches. So the tree creation process will not start from the beginning, but from a certain level of height. Such a planted tree trunk costs some memory but contributes to speed-up, noise reduction and better compression.

Suppose the depth of the tree is $l_{max}$=100 and the data size is such that the number of nodes in the tree is M(n)=$10^6$. This means that in the worst case the codeword for the 1000 length phrase requires 4+log$10^6$=24 bits. This is quite a good compression of 24 to 4000, but the price is the time processing. The "search" procedure in the 1000 levels of the tree takes, probably, more than 2.5 msec as required from real time considerations. Eventually, it is worthwhile to sacrifice one "idle" period to gain such excellent compression ratio. However, we try to minimize the processing time, creating a code for the 1000 length phrase needs at least 1000 search "questions" while descending on the tree from the root.

The "question" is, $$\rho_l(\bar{u}, \bar{v}) = \left(\frac{(l-1)\rho_{l-1}(\bar{u}, \bar{v}_f) + d(\bar{u}_l, \bar{v}_l)}{l}\right) \leq D \quad (10)$$

Clearly, the problem is more severe in case the "distance" itself requires some computation (such in multi colors image).

In each level the question should be verified from one time to 16. But it is more probable the number is decreasing down in the tree, since the "D balls" tend to overlap.

The combination of the distance of the last cell is diminished as the algorithm descending along the tree.

We estimate the number of question as, say 3000, for this extreme case. Thus, it cannot be accomplished in 2.6 msec.

A special hardware to implement the "question" could be helpful. It is not a complicated one, since it requires some feedback and a multiplier. The benefit is that the speed up is growing, especially in the more complicated images. In cases where the "distances" between cells are not stored in a look u table, a special hardware could be useful to calculate the distance each time.

The possibility of limiting the size of the tree is also a possible solution to complexity of time and space. The cost is either the reduction of compression performance or creating an error. However, the receiver should be notified to stop building the tree. After all, identical trees should be constructed in the modems at both ends of the link as data is transmitted.

The optimal tree in the limited size version is the tree which the sets associated to its nodes have the maximal probability. Since, the first to come strings are usually, more probable than the late to come it is reasonable to stop create the tree and assume the obtained tree in not far from the optimal tree.

A more advanced version, is the possibility to exchange between phrases which seem to be more probable that some node in the tree.

4.4 Conclusions

It seems that the combination of a dynamic compression dictionary, efficient memory and processor use and beneficial use of the human eyes capabilities and image properties will lead to choose the following method to be a basis of future standards. The fact that CCITT has already chosen Lempel Ziv algorithm to be the standard for modems as V.42 bits standard may contribute to standardize the following methods and means.

Figure 4:
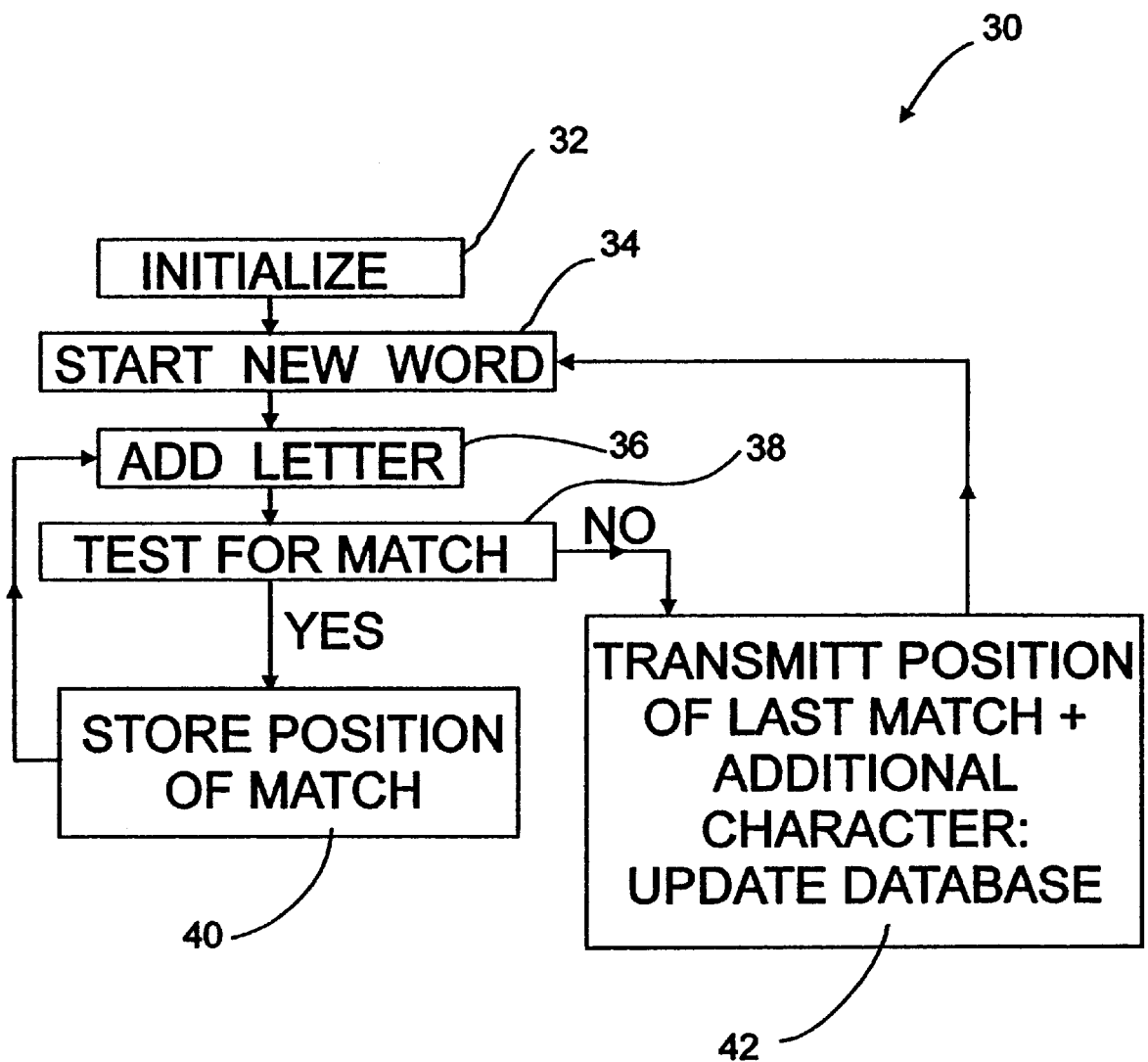
FIG. 4 is a block diagram of a second method for lossy compression of data, operative according to the teachings of the present invention.

Turning now to FIG. 4, there is shown a method, generally designated 30, according to Scheme B. After initialization of the database (block 32) a new word is started, i.e., current string length l=1 (block 34). Method 30 then proceeds by inputting the next, or initial, source data character and adding it to the current string (block 36). Method 30 then search within the database for a database substring corresponding within a given average distortion tolerance level per character to the current string (block 38). If a match is found, method 30 stores the position in the database at which the match was found and increments current string length l (block 40), before returning to block 36. When a match is no longer found, method 30 proceeds to block 42. At this point, method 30 encodes the current string in terms of the location of the last match found in the database and a code character corresponding with zero distortion to the last source data character added to the current string. In the case of a linear database, the location of the last match is denoted by its position and length. In the case of a tree structure the index of the terminal (father) node is specified.

In the case of a linear database, the details of block 38 are equivalent to those of block 16 described with reference to FIG. 3. In the case of a database with a tree structure, this will, of course, affect the details of algorithm of block 38.

The following compression algorithms can be used to solve the identification problem. That is, given a few hypotheses represented by a few databases of known sampled signals (voice, video etc.), or a filtered or compressed versions of the original known signals, and given unknown signal, then the bast match (maximum likelihood) between the unknown signal and one of the a-priori known signals, will be the pair where the highest compression ratio is obtained while applying the universal compression algorithms, defined in the previous text, or other compression algorithm based on an a-priori known database, on each of the a-priori given database.

In other words, by compressing the unknown signal using the databases corresponding to each of the known sample signals in turn, the best match for the unknown signal is identified with the sample signal of the database which gives greatest compression.

This technique may be employed n any compression technique in which the encoded data includes pointer information to records in a database. For the purposes of the description and accompanying claims, such techniques are referred to collectively as "database-type compression techniques".

The identification technique is preferably used with compression techniques in which a personalized database is generated on the basis on an initial signal. This allows direct generation of a compressed code corresponding to each sample signal for use as the "reference database" for subsequent identification.

Since the question of identification is typically most relevant to voice or image processing, this identification technique may be used to advantage with the lossy compression algorithms described above. However, the technique is not limited to lossy applications, and may equally be used with conventional lossless compression techniques.

REFERENCES

[Ar-73] S. Arimot, *"On the Converse to the Coding Theorem for Discrete Memoryless Channels"*, IEEE Trans. on Inform. Th. IT-19 (1973) pp. 357–359.

[BeOr-97] C. M. Bender, S. A. Orszag "Advanced mathematical methods for scientists and engineers" McGraw-Hill, 1987.

[Be-71] T. Berger, "Rate distortion theory: A mathematical basis for data compression." Prentice-Hall, N.J. 1971.

[Be-93] T. Berger, "Lossy universal encoding". Personnel communication, 1993.

[BeZh-83] T. Berger and Z. Zhang, "Minimum breakdown degradation in binary source encoding." IEEE Trans. inform. Th. IT-29 (1983), pp 807–814.

[Bl-72] R. E. Blahut, "Computation of channel capacity and rate distortion functions," IEEE Trans. on Inform. Th. Vol IT-18 (1972). pp. 460–473.

[Bl-74] R. E. Blahut, "Hypothesis testing and information theory." IEEE Trans. on Inform. Th. Vol. IT-20 (1974). pp. 405–417.

[Bl-76] R. E. Blahut, "Information bounds of the Fano-Kullback type." IEEE Trans. on Inform. Th. Vol. IT-22 (1976). pp. 410–421.

[Bl-87] R. E. Blahut, "Principles and practice of information theory." Addison-Wesly Publishing Co. 1987.

[BlHa-75] N. Bleistein, R. A. Handelsman. "Asymptotic Expansions of Integral". Holt, Rinehart Winston 1975.

[Br-57] L. Breiman, "The individual ergodic theorem of information theory". Ann. Math. Stat. 28 (corrected in 31 809–810) (1957); 809–811.

[CoEg-82] T. M. Cover and A. El Gamal, "Achievable rates for multiple descriptions," IEEE Trans. on Inform. Th. Vol. IT-28 (1982). pp. 851–857.

[Co-92] Y. Covo,: "Error bounds for noiseless channels by an asymptotic large deviations theory". M. Sc. Thesis. Tel-Aviv University, 1992.

[CoS-91] Y. Covo, Z, Schuss: "Error bounds for noiseless channels by an asymptotic large deviations theory". Preliminary report. 1991.

[CsLo-71] I. Csiszar and G. Longo, "On the error exponent for source coding and for testing simple statistical hypothesis". First published in the Hungarian Academy of Sciences, Budapest 1971.

[Da-73] L. Davisson, "Universal noiseless coding." IEEE Trans. on Inform. Th. IT-19 (1973): pp 783–795.

[DuKo-79] J. Korner, "Reliability function of a Discrete Memoryless Channel at Rates above Capacity". IEEE Trans. on Inform. Th. IT-25 (1979). pp. 82–85.

[Gal-76] R. G. Gallager, "Information theory and reliable communication" Wiley, N.Y. 1976.

[Ga-85] C. W. Gardiner, "Handbook of stochastic methods for physics, chemistry and the natural sciences". Springer 1985.

[El-75] P. Elias, "Universal codeword sets and representations of the integers". IEEE Trans. on Inform. Th. Vol. IT-21 (1975). pp 194–203.

[Ell-85] R. S. Ellis, "Entropy, large deviations and statistical mechanics." Springer Verlag 1985.

[Fi-66] B. M. Fittinghof, "Coding in the case of unknown and changing message statistics." (in Russian), P.P.I. 2 (1966): pp. 3–11.

[Gr-75] R. M. Gray, "Sliding block source coding". IEEE Trans. on Inform. Th. Vol. IT-21 (1975). pp. 357–368.

[GNO-75] R. M. D. L. Neuhoff and J. K. Omura "Process definitions of distortion rate functions and source coding theroems." IEEE Trans. on Inform. Th. Vol IT-21 (1975). pp. 524–532.

[Ka-47] M. Kac, "On the notion of recurrence in discrete stochastic process." Bull. American Math. Society, Vol. 53, pp. 1002–1010. 1947.

Ki-78 J. C. Kieffer, "A unified approach to weak universal source coding." IEEE Trans. on Inform. Th. Vol. IT-24 No. 5 (1978). pp. 674–682.

[KMST-85] C. Knessl, B. J. Matkowsky, Z, Schuss, C. Tier, "An asymptotic theory of large deviations for Markov jump processes." SIA J. Appl. Math. Vol 46 No. 6, December 1985, pp. 1006–1028.

[LZ-77] A. Lempel and J. Ziv, "A universal algorithm for sequential data compression." IEEE Trans. on Information Th. Vol. IT-23 (1977) pp. 337–343.

[LZ-78] A. Lempel and J. Ziv. "Compression of individual sequences via variable-rate coding", IEE Trans. on Information Th. IT-24 (1978) pp. 530–536.

[MaPu-78] K. M. Mackenthun and M. B. Pursley, "Variable rate universal block source coding subject to a fidelity constraint." IEEE Trans. on Information Th. IT-24 No. 3, (1978pp. 340–360.

[Ma-74] K. Marton, "Error exponent for source coding with a fidelity criterion." IEEE Trans. on Information Th. IT-20, (1974) pp., 197–199

[Ne-75] D. L. Neuhoff, "Fixed rate universal block source coding with a fidelity criterion." IEEE Trans. on Information Th. IT-21 No. 5, (1975) pp. 511–523.

[Om-73] J. Omura. "A coding theorem for discrete time sources." IEEE Trans. on Information Th. IT-19, (1973) pp. 490–498.

[OS-93] D. S. Ornstein and P. C. Shields, "Universal almost sure data compression." The Annals of Probability, Vol. 18 (1990) pp. 441–452.

[OW-93] D. S. Ornstein and B. Weiss, "Entropy and Data Compression Schemes." IEEE Transaction on information theory, Vol-39, No. 1 January 1993.

[RPE-81] M. Rodeh, V. Pratt and S. Evan, "Linear algorithm for data compression via string matching." Journal of the ACM, Vol. 28, pp. 16–24, Jan. 1981,

[Sa-92] I. Sadeh, "On digital data compression—the asymptotic large deviations approach." The Proceedings of the 1992 Conference on Information Sciences and Systems. Princeton University, the department of electrical engineering, March 1992.

[Sa] I. Sadeh, "Data compression by block-coding of an ergodic source subject to a fidelity criterion." Submitted for publication, 1993.

[Sa-] I. Sadeh, "On the distribution of the empirical distribution, Sanov-Bahadur-Zabell problem and application." In preparation.

[Sh-48] C. E. Shannon. "A mathematical theory of communication.". Bell Systems Tech. J. 27, pp. 379–423, 623–656. (1948).

[Sh-59] C. E. Shannon, "Coding theorems for a discrete source with a fidelty criterion". IRE Nat. Conv. Rec. Part 4 (1959) pp. 142–163.

[WZ-89] A. D. Wyner and J. Ziv, "Some asymptotic properties of the entropy of a stationary ergodic data source with applications to data compression." IEEE Trans. on Inform. Th. Vol. 35, pp. 1250–1258 Nov. 1989.

[Z-72] J. Ziv, "Coding of sources with unknowns statistics—Part 1: Probability of encoding error; Part 2: Distortion relative to a fidelity criterion". IEEE Trans. on Inform. Th. IT-18 (1972). pp: 384–394.

What is claimed is:

1. A method for compressing source data for transmission to a remote location or to a storage medium, the source data being made up of data units from a first alphabet U, the source data units being mappable on to code data units of a second alphabet V, there being defined a distortion measure indicative of the distortion caused by encoding any given source data unit as any given code data unit, the method comprising the steps of:

(a) setting a current string length, l, to an initial value;

(b) inputting l data units of source data to generate a current string;

(c) searching within at least part of a tree-structured database of code data units for a database substring corresponding within a given non-zero average distortion tolerance level per data unit to said current string, said tree-structured database of code data units being structured as a multi-branch structure in which at least one node has in excess of two nodes branching therefrom;

(d) in a case that such a said database substring is found:
  (i) storing last-find pointer information relating to the location within said database of said database substring which corresponds within said average distortion tolerance level per data unit to said current string.
  (ii) inputting a next data unit of source data and appending said data unit to said current string such that said current string contains l+1 data units made up of a most recently found string and a most recently added data unit,
  (iii) incrementing said current string length, l, by 1, and
  (iv) returning to step (c); and (e) when no such said database substring is found:
  (i) transmitting a compressed data signal indicative of:
    (A) said last-find pointer information, and
    (B) a code data unit corresponding to said most recently added unit of said current string, and
  (ii) updating said database to include a database substring corresponding within said average distortion tolerance level per data unit to said current string.

2. The method of claim 1, wherein said last-find pointer information includes information to identify a terminal node at the termination of a path corresponding to said most recently found string.

3. The method of claim 1, wherein said step of updating said database is performed by adding a new branch corresponding to said most recently added data unit to said terminal node.

4. The method of claim 1, wherein the method is repeated until said tree structure utilizes all available memory, the method subsequently continuing without further updating of said database.

5. The method of claim 1, further comprising a step of re-defining said database substring added by said updating based upon analysis of subsequent source data.

\* \* \* \* \*